(12) United States Patent
Park

(10) Patent No.: US 7,897,424 B2
(45) Date of Patent: *Mar. 1, 2011

(54) METHOD OF MANUFACTURING AN ELECTRICAL-MECHANICAL MEMORY DEVICE

(75) Inventor: Jin-Jun Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 367 days.

This patent is subject to a terminal disclaimer.

(21) Appl. No.: 12/069,772

(22) Filed: Feb. 13, 2008

(65) Prior Publication Data

US 2008/0198649 A1     Aug. 21, 2008

(30) Foreign Application Priority Data

Feb. 15, 2007    (KR) .................. 10-2007-0015786

(51) Int. Cl.
  H01L 21/00    (2006.01)
  H01L 29/84    (2006.01)
  G11C 11/34    (2006.01)
  G11C 16/04    (2006.01)
(52) U.S. Cl. ............. 438/52; 438/50; 257/415; 365/174; 365/185.03
(58) Field of Classification Search .................... 438/50, 438/53, 52; 257/415; 365/174
See application file for complete search history.

(56) References Cited

U.S. PATENT DOCUMENTS

| | | | |
|---|---|---|---|
| 5,774,414 A | 6/1998 | Melzner et al. | |
| 6,054,745 A | 4/2000 | Nakos et al. | |
| 6,100,109 A | 8/2000 | Melzner et al. | |
| 6,473,361 B1 | 10/2002 | Chen et al. | |
| 6,625,047 B2 | 9/2003 | Coleman, Jr. | |
| 6,750,742 B2 | 6/2004 | Kang et al. | |
| 7,071,023 B2 | 7/2006 | Bertin et al. | |
| 7,122,942 B2 | 10/2006 | Song et al. | |
| 7,790,494 B2 * | 9/2010 | Kim et al. ................. | 438/52 |
| 2004/0181630 A1 | 9/2004 | Jaiprakash et al. | |
| 2005/0037547 A1 | 2/2005 | Bertin et al. | |
| 2005/0230271 A1 | 10/2005 | Levon et al. | |

(Continued)

FOREIGN PATENT DOCUMENTS

JP         2000-31397        1/2000

(Continued)

OTHER PUBLICATIONS

Decision of Grant, issued Sep. 23, 2008, in related Korean Application No. 10-2007-0050226.

(Continued)

Primary Examiner — N Drew Richards
Assistant Examiner — Michael Jung
(74) Attorney, Agent, or Firm — Mills & Onello, LLP

(57) ABSTRACT

A memory device includes a bit line, a reading word line, a bit line contact, an electrode, a writing word line and a contact tip. The bit line is formed on a substrate. The reading word line is formed over the bit line. The bit line contact is disposed between adjacent reading word lines. The electrode extends substantially in parallel to the reading word line and includes a conductive material being bent in response to an applied voltage. The writing word line is formed over the electrode and is separated from the electrode. The contact tip is formed at an end portion of the electrode and is separated from the reading and the writing word lines. The contact tip protrudes toward the reading word line or writing word line.

15 Claims, 19 Drawing Sheets

U.S. PATENT DOCUMENTS

| | | | |
|---|---|---|---|
| 2005/0279988 A1* | 12/2005 | Bertin | 257/9 |
| 2006/0128046 A1 | 6/2006 | Onishi | |
| 2006/0166393 A1 | 7/2006 | Ha et al. | |
| 2007/0015303 A1* | 1/2007 | Bertin et al. | 438/50 |
| 2008/0048246 A1 | 2/2008 | Yun et al. | |
| 2008/0137404 A1* | 6/2008 | Park | 365/164 |
| 2008/0144364 A1 | 6/2008 | Lee et al. | |
| 2008/0185668 A1* | 8/2008 | Kim et al. | 257/415 |
| 2008/0198649 A1 | 8/2008 | Park | |
| 2008/0219048 A1 | 9/2008 | Lee et al. | |
| 2009/0053846 A1* | 2/2009 | Rueckes et al. | 438/50 |
| 2009/0072296 A1 | 3/2009 | Lee et al. | |
| 2009/0072297 A1 | 3/2009 | Lee et al. | |
| 2009/0097315 A1 | 4/2009 | Yun et al. | |
| 2009/0115009 A1 | 5/2009 | Lee et al. | |
| 2010/0038731 A1* | 2/2010 | Van Kampen et al. | 257/415 |

FOREIGN PATENT DOCUMENTS

| | | |
|---|---|---|
| JP | 2004-63605 | 2/2004 |
| KR | 2001-0032068 | 4/2001 |
| KR | 2001-0107918 | 12/2001 |
| KR | 10-0417481 | 1/2004 |
| KR | 10-2004-0035678 | 4/2004 |
| KR | 10-0434369 | 6/2004 |
| KR | 10-2006-0085426 | 7/2006 |
| KR | 10-0621827 | 9/2006 |
| KR | 10-0850273 | 7/2008 |
| KR | 10-0876088 | 12/2008 |
| KR | 10-0876948 | 12/2008 |
| KR | 10-0936810 | 1/2010 |

OTHER PUBLICATIONS

Decision of Grant, issued Sep. 29, 2008, in related Korean Application No. 10-2007-0050223.

"Multibit Electro-Mechanical Memory Device and Method of Manufacturing the Same" Specification, Drawings, and Prosecution History of U.S. Appl. No. 12/074,645, filed Mar. 5, 2008, by Ji-Myoung Lee, et al., which is stored in the United States Patent and Trademark Office (USPTO) Image File Wrapper (IFW) system.

"Multibit Electro-Mechanical Memory Device and Method of Manufacturing the Same" Specification, Drawings, and Prosecution History of U.S. Appl. No. 12/154,449, filed May 23, 2008, by Ji-Myoung Lee, et al., which is stored in the United States Patent and Trademark Office (USPTO) Image File Wrapper (IFW) system.

"Multibit Electro-Mechanical Memory Device and Method of Manufacturing the Same" Specification, Drawings, and Prosecution History of U.S. Appl. No. 12/154,473, filed May 23, 2008, by Eun-Jung Yun, et al., which is stored in the United States Patent and Trademark Office (USPTO) Image File Wrapper (IFW) system.

"Multibit Electro-Mechanical Memory Device and Method of Manufacturing the Same" Specification, Drawings, and Prosecution History of U.S. Appl. No. 12/154,474, filed May 23, 2008, by Ji-Myoung Lee, et al., which is stored in the United States Patent and Trademark Office (USPTO) Image File Wrapper (IFW) system.

* cited by examiner

METHOD OF MANUFACTURING AN ELECTRICAL-MECHANICAL MEMORY DEVICE

CROSS-REFERENCE TO RELATED APPLICATION

This application claims priority under 35 U.S.C. §119 to Korean Patent Application No. 10-2007-0015786 filed in the Korean Intellectual Property Office on Feb. 15, 2007.

BACKGROUND OF THE INVENTION

1. Field of the Invention

Example embodiments of the present invention relate to a memory device and a method of manufacturing a memory device. More particularly, example embodiments of the present invention relate to an electrical-mechanical memory device including an electrode capable of bending in response to an applied voltage, and a method of manufacturing the memory device.

2. Description of the Related Art

Memory devices with large capacity are in demand in response to developments of mobile devices, multimedia devices, etc. A conventional memory device is fabricated using a metal oxide semiconductor field effect transistor (MOSFET). However, as a design rule of the memory device decreases to provide the memory device with large capacity, a short channel effect and increases of resistance and parasitic capacitance may result in the conventional memory device. Also, the memory device having the MOSFET is conventionally provided on a single crystalline silicon semiconductor substrate so that several memory devices may not be properly stacked on the substrate.

Considering these drawbacks in the conventional device, a device has been developed instead of the conventional MOSFET. A micro electromechanical system (MEMS) and a nano electromechanical system (NEMS) are employed in manufacturing current semiconductor devices. For example, a memory device including carbon nanotubes is disclosed in U.S. Patent Application Publication No. 2004/0181630 or U.S. Patent Application Publication No. 2006/0128049. In the memory device according to the above U.S. Patent Application Publications, data may be stored or erased by contacting carbon nanotube fabrics with an upper electrode or a lower electrode.

In the conventional memory device, the data is stored by mechanically moving the carbon nanotube fabric toward the lower electrode or the upper electrode. Thus, various materials including semiconductor materials may be used for a substrate so that several memory devices may be easily stacked on the substrate and a capacity of the conventional memory device may be easily increased. However, the conventional memory device including the carbon nanotube fabric may also have some drawbacks.

For example, when the carbon nanotube fabric makes contact with the lower electrode, a high voltage is applied to the carbon nanotube fabric and the lower electrode so that the carbon nanotube fabric overcomes a tension of the carbon nanotube fabric supported by a nitride layer on an insulating interlayer. Thus, power consumption of the conventional memory device may greatly increase.

Further, van der Waals forces may markedly affect the carbon nanotube fabric and the lower electrode or the upper electrode when a distance between the lower electrode and the carbon nanotube or the upper electrode and the carbon nanotube fabric is maintained by a nano-scale. Accordingly, the lower electrode or the upper electrode of the conventional memory device may not be easily separated from the carbon nanotube fabric due to an attractive force caused by the van der Waals forces after the carbon nanotube fabric makes contact with the lower electrode or the upper electrode. Additionally, repeated bending of the carbon nanotube fabrics may degrade operation characteristics of the conventional memory device, so, repeatedly bending the carbon nanotube fabric may need to be avoided.

Moreover, the carbon nanotube fabrics may not easily move when dimensions of the carbon nanotube fabrics decrease. Although the dimensions of the carbon nanotube fabrics increases to move the carbon nanotube fabrics toward the lower electrode or the upper electrode, a size of a unit cell of the conventional memory device may not decrease to a desired level when the carbon nanotube fabrics have large dimensions.

SUMMARY OF THE INVENTION

Example embodiments of the present invention provide a memory device including a unit cell of a reduced size and stably operating with a low voltage.

Example embodiments of the present invention provide a method of manufacturing a memory device including a unit cell of a reduced size and stably operating with a low voltage.

According to one aspect of the present invention, there is provided a memory device which includes a bit line formed on a substrate, a reading word line, a bit line contact, an electrode, a writing word line and a contact tip. The reading word line is positioned over the bit line and is electrically insulated from the bit line. The bit line contact is electrically connected to the bit line and is disposed between the reading word lines. The bit line contact has an upper face substantially lower than an upper face of the reading word line. The electrode is electrically connected to the bit line contact. The electrode extends substantially in parallel to the reading word line and includes a conductive material being bent in response to an applied voltage. The writing word line is formed over the electrode and is separated from the electrode. The writing word line corresponds to the reading word line and the electrode. The contact tip is formed at an end portion of the electrode and is separated from the reading word line and the writing word line. The contact tip protrudes toward the reading word line or the writing word line.

In example embodiments, the memory device may additionally include a first insulating interlayer pattern formed between the bit line and the reading word line. The first insulating interlayer pattern may support the reading word line.

In example embodiments, the memory device may further include a second insulating interlayer pattern between adjacent first insulating interlayer patterns. The second insulating interlayer pattern may have an upper face substantially lower than that of the reading word line.

In example embodiments, the memory device may additionally include an insulation layer pattern formed on the electrode. The insulation layer pattern may be electrically connected to the bit line contact.

In example embodiments, a sidewall of the insulation interlayer pattern may make contact with a sidewall of the writing word line and may support the writing word line.

In example embodiments, the memory device may further include a charge trapping structure formed below the writing word line. The charge trapping structure may include an oxide layer pattern, a charge trapping layer pattern and a dielectric layer pattern. The charge trapping structure may be separated from the electrode. The charge trapping layer pattern may trap charges therein.

In example embodiments, the bit line may extend along a first direction and the reading and the writing word lines may extend along a second direction substantially perpendicular to the first direction.

In example embodiments, the electrode and the contact tip may include titanium, titanium nitride and/or a carbon nanotube.

According to another aspect of the present invention, there is provided a method of manufacturing a memory device. In the method of manufacturing the memory device, a bit line is formed on a substrate. A preliminary reading word line is formed over the bit line. The preliminary reading word line is electrically insulated from the bit line. A bit line contact is formed between adjacent preliminary reading word lines. The bit line contact has an upper face substantially lower than an upper face of the preliminary reading word line and makes contact with the bit line. A preliminary contact tip is formed over a central portion of the preliminary reading word line and is separated from the preliminary reading word line. A preliminary electrode is formed on the bit line contact and the preliminary contact tip. The preliminary electrode extends substantially in parallel to the preliminary reading word line and includes a conductive material being bent in response to an applied voltage. A preliminary writing word line is formed over the preliminary electrode and is separated from the preliminary contact tip. The preliminary writing word line corresponds to the preliminary electrode and the preliminary reading word line. Central portions of the preliminary writing word line, the preliminary contact tip, the preliminary electrode and the preliminary reading word line are etched to form a writing word line, a contact tip, an electrode and a reading word line.

In example embodiments, a first insulating interlayer may be formed on the substrate to cover the bit line after forming the bit line. A first sacrificial layer and a first hard mask layer may be formed on the first insulating interlayer. The first insulating interlayer, the first sacrificial layer and the first hard mask layer may be patterned, such as by an etching process, to form a first insulating interlayer pattern, a first sacrificial layer pattern and a first hard mask.

In example embodiments, a second insulating interlayer pattern may be formed on the substrate between adjacent first insulating interlayer patterns. The second insulating interlayer pattern may have an upper face substantially lower than an upper face of the preliminary reading word line.

In example embodiments, a spacer may be formed on sidewalls of the preliminary reading word line and the first sacrificial layer pattern.

In a formation of the bit line contact, a photoresist pattern may be formed on the second insulating interlayer pattern, the spacer and the first hard mask. The second insulating interlayer pattern may be partially etched using the first hard mask, the spacer and the photoresist pattern to form an opening that exposes the bit line. A first conductive layer may be formed to fill up the opening. The first conductive layer may be partially removed to form the bit line contact in the opening. The bit line contact may have an upper face substantially lower than an upper face of the preliminary reading word line.

In partially removing the first conductive layer, the first hard mask may be exposed by planarizing the first conductive layer to form a preliminary bit line contact. The preliminary bit line contact may be etched until the preliminary bit line contact has an upper face substantially lower than the upper face of the reading word line.

In example embodiments, the first hard mask may be removed from the first sacrificial layer pattern after forming the bit line contact.

In a formation of the preliminary contact tip, the first hard mask may be removed from the first sacrificial layer pattern. The first sacrificial layer pattern may be partially etched to form a dimple. A conductive layer pattern may be formed to fill up the dimple. The conductive layer pattern may protrude from the first sacrificial layer pattern.

In example embodiments, the bit line may extend along a first direction and the preliminary word line may extend along a second direction substantially perpendicular to the first direction.

In example embodiments, a preliminary charge trapping structure may be formed below the preliminary writing word line and is separated from the preliminary electrode. The preliminary charge trapping structure may include a preliminary oxide layer pattern, a preliminary charge trapping layer pattern and a preliminary dielectric layer pattern.

In example embodiments, a second sacrificial layer may be additionally formed on the preliminary electrode.

In a formation of the preliminary writing word line, a second conductive layer may be formed on the second sacrificial layer. A second hard mask may be formed on the second conductive layer. The second conductive layer and the second sacrificial layer may be etched using the second hard mask to form an opening that exposes an upper face of the preliminary electrode.

In example embodiments, an insulation layer may be formed on the second hard mask to fill up the opening. The insulation layer may be planarized to form an insulation layer pattern in the opening.

In example embodiments, layers among the contact tip, the electrode and the reading word line may be removed after forming the writing word line. The layers may be positioned between the reading word line and the contact tip, between the reading word line and the electrode, between the writing word line and the contact tip and between the writing word line and the electrode.

In example embodiments, the preliminary electrode and the preliminary contact tip may include titanium, titanium nitride and/or a carbon nanotube.

According to the present invention, an electrode extending from a bit line toward a reading word line may have a length substantially longer than that of the conventional electrode. When the electrode has a relatively long length, a pull-in voltage between the bit line and the reading word line may effectively decrease. Thus, a writing operation of a memory device may be carried out with a low voltage.

Further, a contact tip may be provided on at least one end portion of the electrode such that intervals among the electrode, the writing word line and the reading word line may increase. Hence, undesired residues may be effectively reduced in gaps among the electrode, the writing word line and the reading word line, and a leakage current cased by the undesired residues may be considerably decreased.

As the intervals among the electrode, the reading word line and the writing word line are enlarged, the undesired residues may be effectively reduced in the intervals among the electrode, the reading word line and the writing word line. Therefore, the leakage current of the memory device may be effectively decreased. Additionally, cross talk between adjacent conductive lines may be decreased because a distance between the bit line and the writing word line where a high voltage is applied may be reduced.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DESCRIPTION OF EMBODIMENTS

Figure 1:
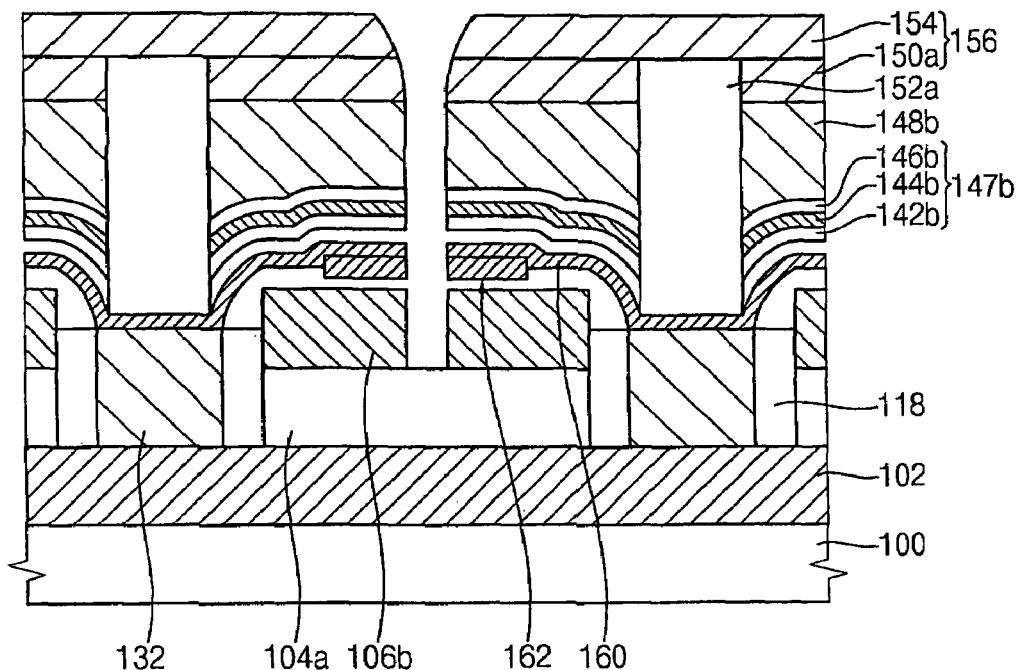
FIGS. 1 and 2 are cross-sectional views illustrating a memory device in accordance with example embodiments of the present invention.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
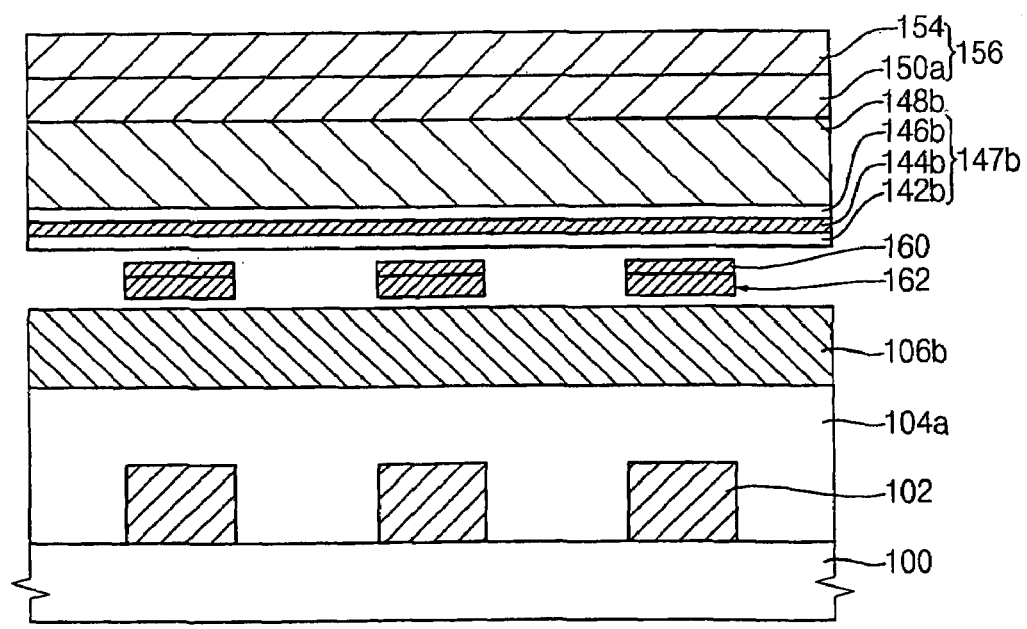
Figure 3:
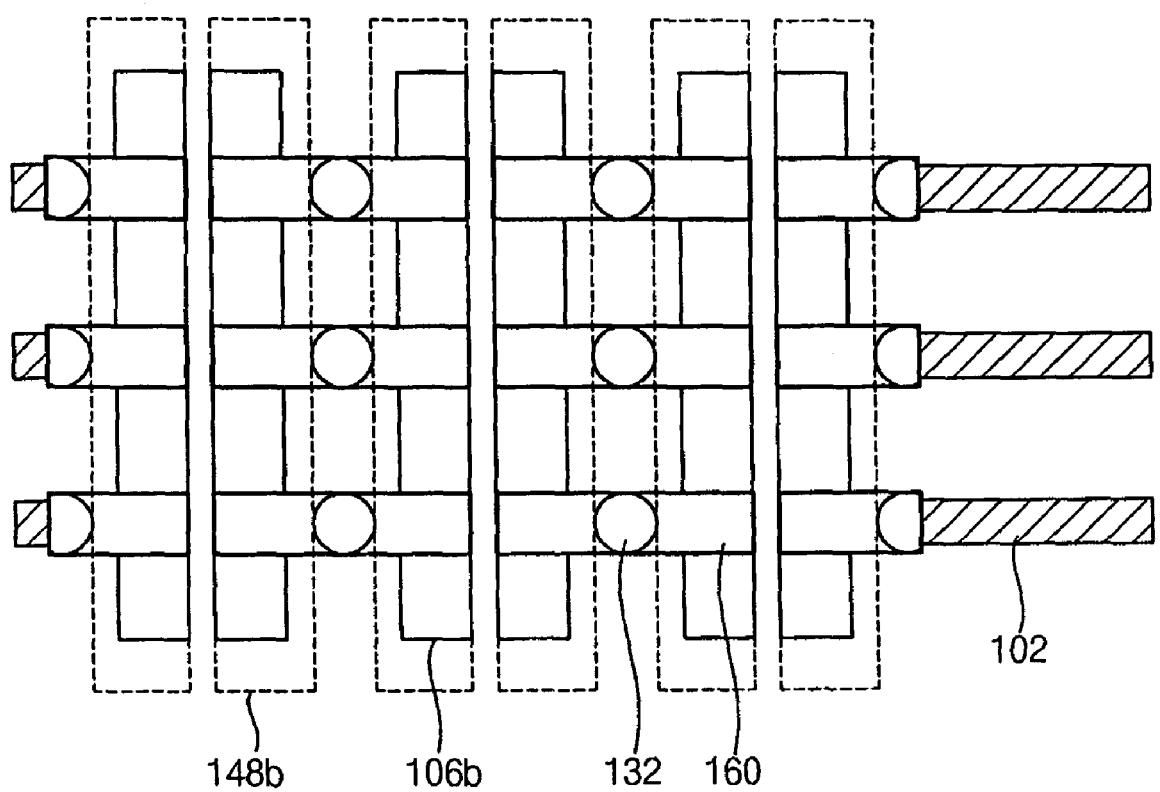
FIG. 3 is a plan view illustrating a memory device in accordance with example embodiments of the present invention.

FIGS. 1 and 2 are cross-sectional views illustrating a memory device in accordance with example embodiments of the present invention. FIG. 3 is a plan view illustrating the memory device in FIGS. 1 and 2.

FIG. 1 illustrates the memory device along a first direction, whereas FIG. 2 illustrates the memory device along a second direction substantially perpendicular to the first direction. For example, the first and the second directions may be respectively in parallel to a bit line 102 and a word line in the memory device.

Referring to FIGS. 1 to 3, a substrate 100 having a level upper face is provided. A lower portion of the substrate 100 may include an insulation material, a conductive material or a semiconductor material, and an upper portion of the substrate 100 may include the insulation material. In an example embodiment, both of the upper and the lower portions of the substrate 100 may include the insulation materials. Alternatively, the lower portion of the substrate 100 may include a metal or the semiconductor material when the upper portion of the substrate 100 includes the insulation material.

The memory device includes the bit line 102 formed on the substrate 100. The bit line 102 may extend along the first direction. The bit line 102 may include a material having a good electrical conductivity. For example, the bit line 102 may include a metal, a metal compound or polysilicon doped with impurities. Examples of the metal in the bit line 102 may include aluminum (Al), tungsten (W), titanium (Ti), tantalum (Ta), gold (Au), silver (Ag), copper (Cu), etc. Examples of the metal compound in the bit line 102 may include tungsten silicide ($WSi_x$), titanium nitride ($TiN_x$), tantalum silicide ($TaSi_x$), etc.

A first insulating interlayer pattern 104a and a second insulating interlayer pattern 118 are formed on the substrate 100 to cover the bit line 102. The first and the second insulating interlayer patterns 104a and 118 may sufficiently fill up gaps generated between adjacent bit lines 102.

The first insulating interlayer pattern 104a may include an oxide such as silicon oxide. The first insulating interlayer pattern 104a may have a level upper face. The second insulating interlayer pattern 118 is positioned between adjacent first insulating interlayer patterns 104a. The second insulating interlayer pattern 118 may have an upper face substantially higher than that of the first insulating interlayer pattern 104a. That is, the second insulating interlayer pattern 118 may have a height substantially larger than a height of the first insulating interlayer pattern 104a.

A reading word line 106b is located on the first insulating interlayer pattern 104a so as to read data in a reading operation of the memory device. In example embodiments, two reading word lines 106b may be provided on one first insulating interlayer pattern 104a. Here, the reading word lines 106b may be disposed substantially in parallel with each other. Both of the reading word lines 106b may extend in the second direction substantially perpendicular to the first direction. Thus, each of the reading word lines 106b may be positioned over the bit line 102, and may be electrically insulated from the bit line 102.

The reading word line 106b may include a metal, a metal compound or polysilicon doped with impurities. Examples of the metal in the reading word line 106b may include aluminum, tungsten, titanium, tantalum, gold, silver, copper, etc. Examples of the metal compound in the reading word line 106b may include tungsten silicide, titanium nitride, tantalum silicide, etc. In one example embodiment, the reading word line 106b may include a material substantially the same as that in the bit line 102. In another example embodiment, the bit line 102 and the reading word line 106b may include different materials.

A bit line contact hole (not illustrated) is formed through the second insulating interlayer pattern 118. The bit line contact hole may expose a portion of the bit line 102. In example embodiments, one bit line contact hole may be formed between two adjacent reading word lines 106b. For example, the bit line contact hole may be positioned adjacent to a first sidewall of one reading word line 106b, whereas the other reading word line 106b may be opposed to a second sidewall of one reading word line 106b.

A bit line contact 132 is formed between adjacent reading word lines 106b to fill up the bit line contact hole. The bit line contact 132 may be electrically connected to the bit line 102. For example, the bit line contact 132 may make contact with the exposed portion of the bit line 102 through the bit line contact hole. Since the bit line contact 132 is positioned in the bit line contact hole formed through the second insulating interlayer pattern 118, the bit line contact 132 may be electrically insulated from the reading word line 106b. In example embodiments, the bit line contact 132 may have an upper face substantially lower than that of the reading word line 106b. The bit line contact 132 may include a metal, a metal compound or polysilicon doped with impurities. Examples of the metal in the bit line contact 132 may include aluminum, tungsten, titanium, tantalum, gold, silver, copper, etc. Examples of the metal compound in the bit line contact 132 may include tungsten silicide, titanium nitride, tantalum silicide, etc. In one example embodiment, the bit line contact 132 may include a material substantially the same as that of the reading word line 106b and/or that of the bit line 102. In another example embodiment, the bit line 102, the reading word line 106b and the bit line contact 132 may include different materials.

An electrode 160 is formed on the bit line contact 132. The electrode 160 extends over the reading word line 106b. In example embodiments, the electrode 160 may make contact with the bit line contact 132 whereas the electrode 160 may be separated from the reading word line 106b. The electrode 160 may extend in the second direction substantially perpendicular to the first direction while making contact with the bit line contact 132. The electrode 160 may include a conductive material having an elasticity. Thus, the electrode 160 may be bent in a predetermined direction in response to a voltage being applied to the electrode 160. Examples of the conductive material in the electrode 160 having the elasticity may include a metal such as titanium, a metal nitride such as titanium nitride, or other conductive material such as a carbon nanotube. Here, the carbon nanotube included in the electrode 160 may have a crystalline structure in which a plurality of hexagonal rings of carbon isconnected to one another. The carbon nanotube may have a width of several nanometers to several tens of nanometers. The carbon nanotube may have an electrical conductivity substantially similar to that of copper (Cu), and may have a thermal conductivity substantially similar to that of diamond. Further, the carbon nanotube may have a mechanical strength about one hundred times superior to that of steel. The carbon nanotube may also have an elasticity considerably higher than that of carbon fiber. For example, the carbon fiber may be broken when the carbon fiber is extended by about 1 percent based on an original length thereof, whereas the carbon nanotube may tolerate a distortion of about 15 percent based on an original length thereof.

In some example embodiments, the electrode 160 may have a cantilever structure extending from the upper face of the bit line contact 132 along a direction substantially in parallel to the bit line 102. The electrode 160 may be bent toward the reading word line 106b when the voltage applied to the electrode 160, or the electrode 160 may be bent along a direction substantially opposed to the reading word line 106b. In example embodiments, the electrode 160 may be separated from the reading word line 106b and may be substantially in parallel to the reading word line 106b. For example, the electrode 160 may be prolonged from the bit line contact 132 in a direction substantially perpendicular to the bit line contact 132, and the electrode 160 may be bent along a direction substantially in parallel to the reading word line 106b when the bit line contact 132 may have the upper face substantially lower than that of the reading word line 106b.

In example embodiments of the present invention, a length of the electrode 160 extending from the bit line contact 132 may be substantially longer than that of the conventional electrode of the conventional memory device when the electrode 160 has the cantilever structure. When the length of the electrode 160 decreases, the voltage applied to the electrode 160 may increase to properly move the electrode 160 toward the reading word line 106b. When a length of the conventional electrode decreases, a pull-in voltage for separating the conventional electrode from a reading word line may increase. However, the electrode 160 according to example embodiments may have the long length as described above so that a pull-in voltage applied to the electrode 160 for separating the electrode 160 from the reading word line 106b may be reduced. Thus, the memory device may have an improved integration degree because the electrode 160 may have the above-described structure although the electrode 160 may have a length relatively longer than that of the conventional electrode.

An insulation layer pattern 152a is formed on the electrode 160. The insulation layer pattern 152a may be adjacent to the second insulating interlayer pattern 118. For example, the insulation layer pattern 152a may be formed on a portion of the electrode 160 positioned on the bit line contact 132. The insulation layer pattern 152a may extend along a direction substantially perpendicular to the bit line 102. That is, the insulation layer pattern 152a may be vertically prolonged relative to the electrode 160. In example embodiments, the insulation layer pattern 152a may have a bar shape, a pillar shape, a column shape, etc. The insulation layer pattern 152a may have a width substantially smaller than or substantially the same as that of the bit line contact 132.

The charge trapping structure 147b is formed over the electrode 160. The charge trapping structure 147b may make contact with a sidewall of the insulation layer pattern 152a. The charge trapping structure 147b may extend from the sidewall of the insulation layer pattern 152a toward the electrode 160. The charge trapping structure 147b may be separated from the electrode 160 by a predetermined interval.

The charge trapping structure 147b may have a multi-layered construction. In example embodiments, the charge trapping structure 147b may include a silicon oxide layer pattern 142b, a charge trapping layer pattern 144b and a dielectric layer pattern 146b. For example, the charge trapping structure 147b may be formed by sequentially stacking and patterning a silicon oxide layer, a silicon nitride layer and a silicon oxide layer. The charge trapping layer pattern 144b may trap charges therein so that the charges may be stored in the charge trapping layer pattern 144b. Thus, the charges trapped in the charge trapping structure 147b may ensure a contact state between the charge trapping structure 147b and a contact tip 162 without continuously applying a voltage to the electrode 160.

A writing word line 148b is formed on the charge trapping structure 147b. The writing word line 148b may extend from the sidewall of the insulation layer pattern 152a along the second direction. The writing word line 148b may be separated from the electrode 160 by a predetermined distance. The writing word line 148b may be substantially in parallel relative to the reading word line 106b.

The writing word line 148b may include a metal or a metal compound. Examples of the metal in the writing word line 148b may include gold, silver, copper, aluminum, tungsten, titanium, tantalum, etc. Examples of the metal compound in the writing word line 148b may include tungsten silicide, titanium nitride, tantalum silicide, etc.

A mask structure 156 is formed on the writing word line 148b and the insulation layer pattern 152a. The mask structure 156 may include a nitride such as silicon nitride. In example embodiments, the mask structure 156 may include two hard masks 150a and 154 sequentially formed on the writing word line 148b and the insulation layer pattern 152a.

The contact tip 162 is positioned at both end portions of the electrode 160. The contact tip 162 may protrude toward the reading word line 106b or the charge trapping structure 147b. The contact tip 162 may be separated from the reading word line 106b and the charge trapping structure 147b by a predetermined interval. The contact tip 162 may be located between an end portion of the reading word line 106b and an end portion of the charge trapping structure 147b.

The contact tip 162 may include a conductive material having an elasticity. Thus, the contact tip 162 may be bent in a predetermined direction in response to a voltage applied to the contact tip 162. In example embodiments, the contact tip 162 may include a material substantially the same as that in the electrode 160. For example, the contact tip 162 may include a conductive material such as titanium, titanium nitride, a carbon nanotube, etc.

When the electrode 160 moves toward the reading word line 106b or the writing word line 148b, the contact tip 162 may make contact with the reading word line 106b or the charge trapping structure 147b, respectively.

The contact tip 162 may protrude toward the reading word line 106b or the charge trapping structure 147b. The interval between the contact tip 162 and the reading word line 106b may be substantially smaller than the interval between the electrode 160 and the reading word line 106b. Further, the interval between the contact tip 162 and the charge trapping structure 147b may be substantially smaller than the interval between the electrode 160 and the charge trapping structure 147b. Thus, a low pull-out voltage or a low pull-in voltage may bend the contact tip 162 toward the reading word line 106b or the charge trapping structure 147b.

In some example embodiments, spaces may be formed over the electrode 160 and below the electrode 160 prolonged from the bit line contact 132. The electrode 160 and the contact tip 162 may readily move upwardly or downwardly in the spaces. An inactive gas may fill up the spaces. For example, the inactive gas may include a nitrogen gas, a helium gas, an argon gas, etc.

In some example embodiments, an additional insulating interlayer (not illustrated) may be formed between adjacent writing word lines 148b while maintaining the spaces over and below the electrode 160 and the contact tip 162.

In the memory device having the above-described construction, the electrode 160 may make contact with the writing word line 148b by the charges trapped in the charge trapping structure 147b without continuously applying the voltage to the writing word line 148b because of the charges trapped in the charge trapping layer pattern 144b. In this case, the memory device may serve as a non-volatile memory device.

The electrode 160 extending from the bit line contact 132 toward the reading word line 106b may have the length substantially larger than that of the conventional electrode. When the electrode 160 has a relatively long length, the pull-in voltage between the bit line 102 and the reading word line 148b may decrease. Thus, a writing operation of the memory device may be sufficiently carried out with a low voltage.

In the memory device according to the present invention, the contact tip 162 positioned at the end portions of the electrode 160 may protrude toward the reading word line 106b or the charge trapping structure 147b. Thus, the intervals among the contact tip 162, the reading word line 106b and the writing word line 148b may decrease so that the pull-in voltage required for contacting the contact tip 162 to the writing word line 148b may also decrease.

The intervals between the electrode 160 and the reading word line 106b and between the electrode 160 and the writing word line 148b may be sufficiently wide. The attractive forces among the electrode 160, the reading word line 106b and the writing word line 148b caused by the van deer Wails force may be effectively decreased. Therefore, the memory device may stably operate while considerably reducing the attractive forces among the electrode 160, the reading word line 106b and the writing word line 148b.

As the intervals among the electrode 160, the reading word line 106b and the writing word line 148b are enlarged, undesired residues may be effectively reduced in the intervals among the electrode 160, the reading word line 106b and the writing word line 148b. Thus, a leakage current cased by the undesired residues may be considerably reduced.

In the memory device according to the present invention, the reading word line 106b may be provided below the electrode 160 and the writing word line 148b may be positioned over the electrode 160. Therefore, a distance between the bit line 102 and the writing word line 148b may be sufficiently wide so that cross talk between adjacent lines may be greatly decreased.

Hereinafter, operations of the memory device in accordance with example embodiments of the present invention will be described.

When opposite voltages (positive (+) and negative (−) voltages) are applied to the bit line 102 and the writing word line 148b, an attractive force may be generated between the bit line 102 and the writing word line 148b. Thus, the contact tip 162 may move toward the charge trapping structure 147b by the attractive force. A voltage required for contacting the contact tip 162 to the charge trapping structure 147b is referred to as the pull-in voltage (Vpull-in). Thus, the contact tip 162 and the charge trapping structure 147b make contact with each other to record data "0" in the memory device when the voltage more than the pull-in voltage is applied between the bit line 102 and the writing word line 148b.

When like voltages (positive voltages or negative voltages) are applied to the bit line 102 and the writing word line 148b, a repulsive force may be generated between the bit line 102 and the writing word line 148b. A voltage required for separating the contact tip 162 from the charge trapping structure 147b is referred to as the pull-out voltage (Vpull-out). Accordingly, the contact tip 162 and the charge trapping structure 147b may be separated from each other to record data "1" in the memory device when the pull-out voltage is applied to the bit line 102 and the writing word line 148b.

The pull-in voltage and the pull out voltage may correspond to a difference between the voltage applied to the bit line 102 and the voltage applied to the writing word line 148b.

Hereinafter, a method of manufacturing a memory device in accordance with example embodiments of the present invention will be described with reference to the accompanying drawings.

FIGS. 4A to 20B are cross-sectional views illustrating a method of manufacturing a memory device in accordance with example embodiments of the present invention. FIGS. 4A, 5A, 6A, 7A, 8A, 9A, 10A, 11A, 12A, 13A, 14A, 15A, 16A, 17A, 18A, 19A and 20A are cross-sectional views illustrating the memory device taken along a first direction. FIGS. 4B, 5B, 6B, 7B, 8B, 9B, 10B, 11B, 12B, 13B, 14B, 15B, 16B, 17B, 18B, 19B and 20B are cross-sectional views illustrating the memory device taken along a second direction substantially perpendicular to the first direction. For example, the first and the second directions may be substantially in parallel to a bit line 102 and a word line in the memory device, respectively.

Figure 4A:
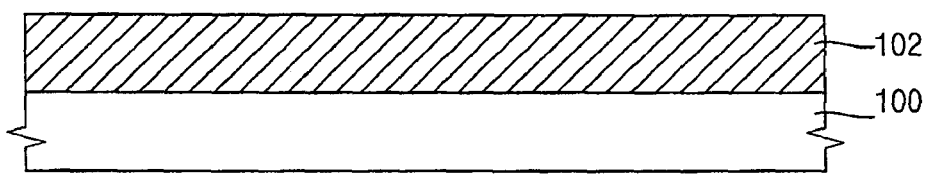
FIGS. 4A to 20B are cross-sectional views illustrating a method of manufacturing a memory device in accordance with example embodiments of the present invention.
Figure 4B:
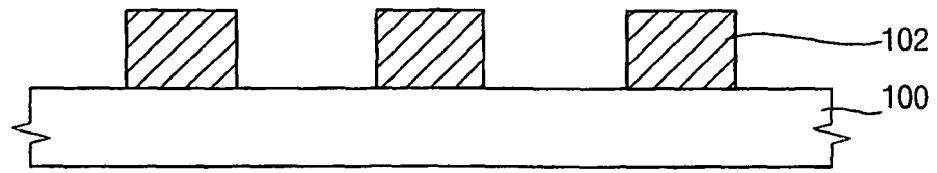

Referring to FIGS. 4A and 4B, a substrate 100 is provided. An upper portion of the substrate 100 may include an electrically insulating material. Alternatively, an insulation layer may be formed on the substrate 100.

A first conductive layer (not illustrated) is formed on the substrate 100. The first conductive layer will be patterned to form the bit line 102 on the substrate 100. The first conductive layer may be formed using a metal, a metal compound or polysilicon doped with impurities. For example, the first conductive layer may be formed using the metal such as gold (Au), silver (Ag), copper (Cu), aluminum (Al), tungsten (W), titanium (Ti), tantalum (Ta), etc. Alternatively, the first conductive layer may be formed using the metal compound such as tungsten silicide ($WSi_x$), titanium nitride ($TiN_x$), tantalum silicide ($TaSi_x$), etc. In example embodiments, the first conductive layer may be formed by a physical vapor deposition (PVD) process or a chemical vapor deposition (CVD) process.

After an etching mask (not illustrated) is formed on the first conductive layer, the first conductive layer is patterned using the etching mask to form the bit line 102 on the substrate 100. For example, the first conductive layer may be etched by an anisotropic etching process. The bit line 102 may extend on the substrate 100 along the first direction. The bit line 102 may have a bar structure, a rod structure, a string structure, etc. The etching mask is removed from the substrate 100 after a formation of the bit line 102.

Figure 5A:
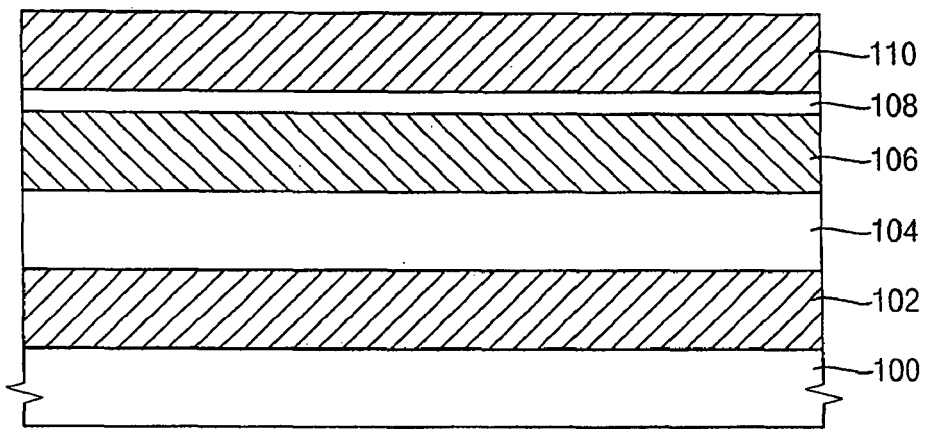
Figure 5B:
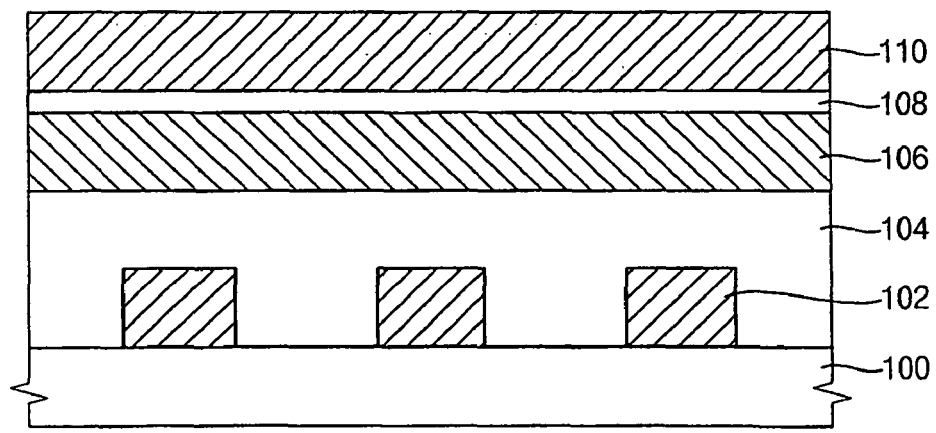

Referring to FIGS. 5A and 5B, a first insulating interlayer 104 is formed on the substrate 100 to cover the bit line 102. The first insulating interlayer 104 may sufficiently fill up gaps between adjacent bit lines 102 and may sufficiently cover the bit line 102. The first insulating interlayer 104 may be formed using an oxide. Examples of the oxide for the first insulating interlayer 104 may include tetraethyl orthosilicate (TEOS), undoped silicate glass (USG), spin on glass (SOG), flowable oxide (FOX), high density plasma-chemical vapor deposition (HDP-CVD) oxide, etc. In example embodiments, the first insulating interlayer 104 may be planarized to have a level upper face by a chemical mechanical polishing (CMP) process and/or an etch-back process. In a planarization of the first insulating interlayer 104, the first insulating interlayer 104 may be partially removed without exposure of the bit line 102 to electrically insulate the bit line 102 from upper conductive structures such as a reading word line 106b (see FIGS. 20A and 20B).

A first word line layer 106 is formed on the first insulating interlayer 104. The first word line layer 106 will be patterned to form the reading word line 106b (see FIGS. 19A and 19B) over the bit line 102. The first word line layer 106 may be formed using a metal or a metal compound. Examples of the metal for the first word line layer 106 may include gold, silver, copper, aluminum, tungsten, titanium, tantalum, etc. Examples of the metal compound for the first word line layer 106 may include tungsten silicide, titanium nitride, tantalum silicide, etc. In one example embodiment, the first word line layer 106 may be formed using a material substantially the same as that of the first conductive layer for the bit line 102. In another example embodiment, the first word line layer 106 and the first conductive layer may be formed using substantially different materials, respectively. The first word line layer 106 may be formed by a PVD process or a CVD process.

A first sacrificial layer 108 is formed on the first word line layer 106. The first sacrificial layer 108 will be removed from the first word line layer 106 in a subsequent process to thereby provide a space between the reading word line 106b and a contact tip 162 (see FIGS. 20A and 20B). In example embodiments, the first sacrificial layer 108 may be formed using a material that may be effectively removed by a wet etching process. For example, the first sacrificial layer 108 may be formed using polysilicon.

Figure 20A:
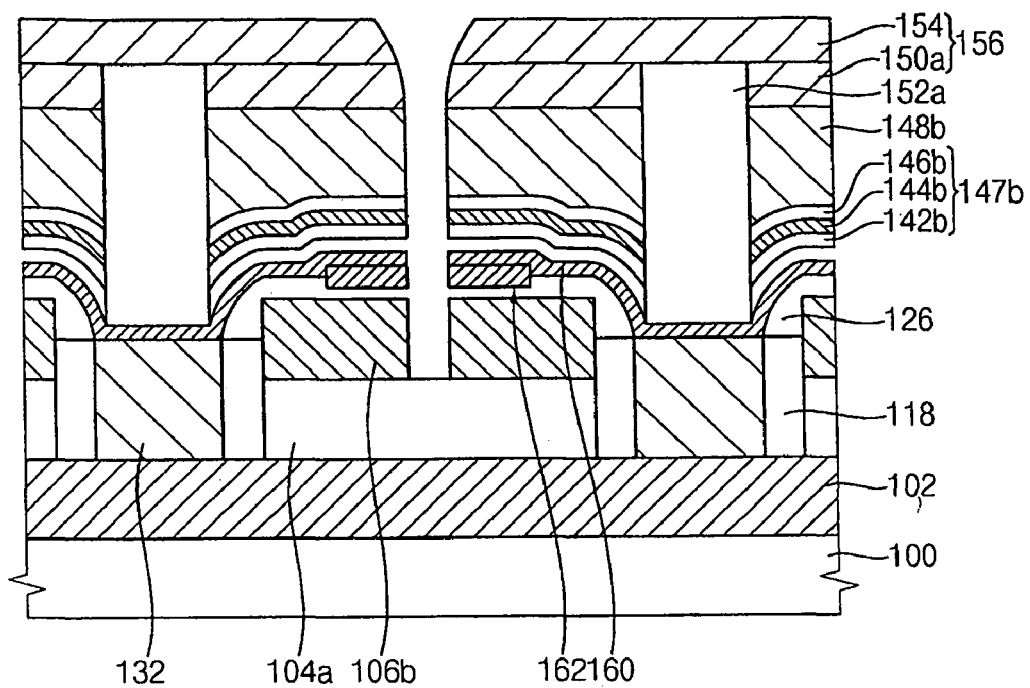
Figure 20B:
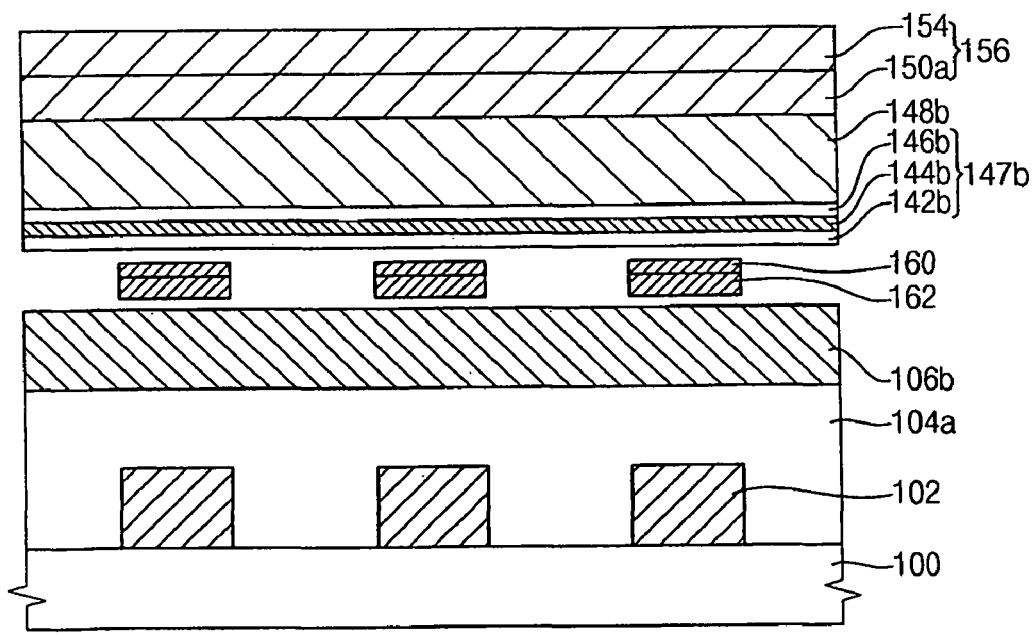

The first sacrificial layer 108 will be removed from the first word line layer 106 in the subsequent process to provide the space between the reading word line 106b and an electrode 160 (see FIGS. 20A and 20B). Thus, the first sacrificial layer 108 may have a thickness substantially the same as an interval between the reading word line 106b and the electrode 160.

A first hard mask layer 110 is formed on the first sacrificial layer 108. The first hard mask layer 110 may be formed using a nitride such as silicon nitride by a CVD process.

Figure 6A:
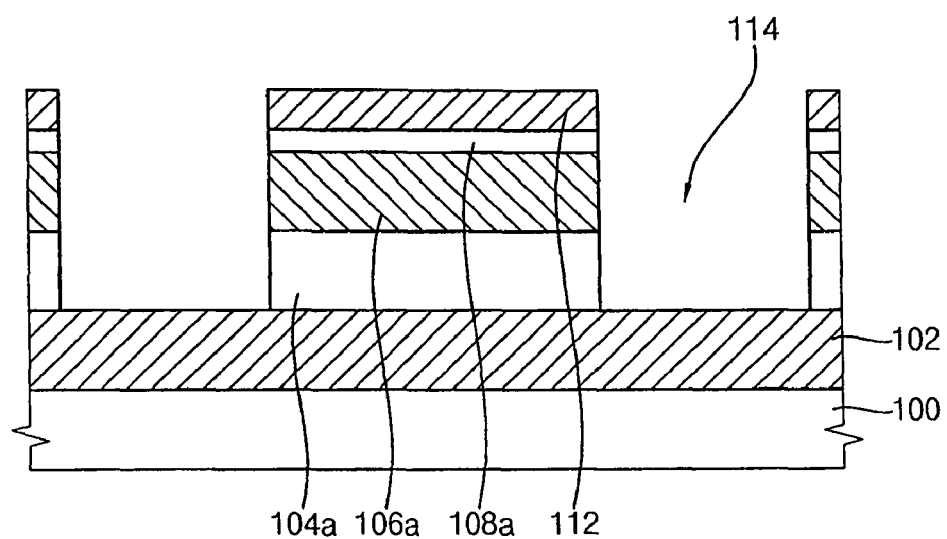
Figure 6B:
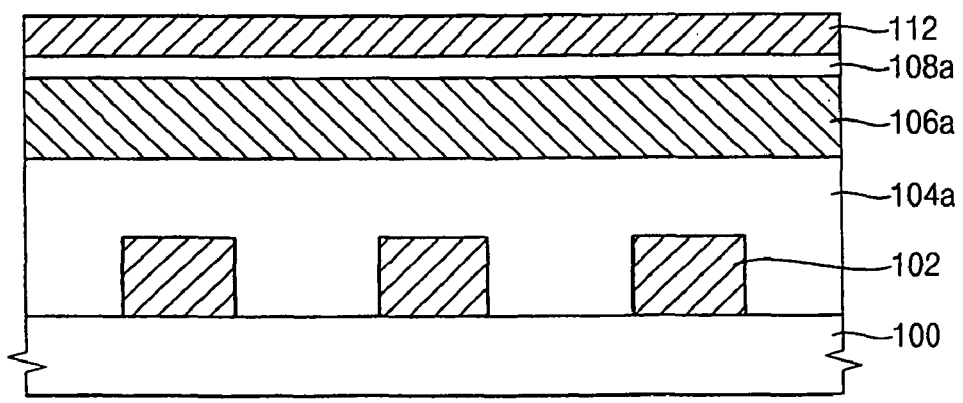

Referring to FIGS. 6A and 6B, a first hard mask 112 is formed on the first sacrificial layer 108 by patterning the first hard mask layer 110. The first hard mask 112 may be formed by a photolithography process. The first hard mask 112 may extend in the second direction substantially perpendicular to the first direction. The first hard mask 112 may have a bar structure, a rod structure, a string structure, etc. A portion of the first sacrificial layer 108 exposed by the first hard mask 112 may be substantially wider than a bit line contact 132 (see FIG. 12A).

The first sacrificial layer 108, the first word line layer 106 and the first insulating interlayer 104 are partially etched using the first hard mask 112 as an etching mask. After partial etching of the first sacrificial layer 108, the first word line layer 106 and the first insulating interlayer 104, a first trench 114 is formed on the bit line 102 positioned on the substrate 100. The first trench 114 may partially expose upper faces of the bit line 102 and the substrate 100. The first trench 114 may extend in the second direction. In formation of the first trench 114, a first insulating interlayer pattern 104a, a preliminary reading word line 106a and a first sacrificial layer pattern 108a are formed on the bit line 102 and the substrate 100. In example embodiments, the first trench 114, the first insulating interlayer pattern 104a, the preliminary reading word line 106a and the first sacrificial layer pattern 108a may be formed by an anisotropic etching process.

Figure 7A:
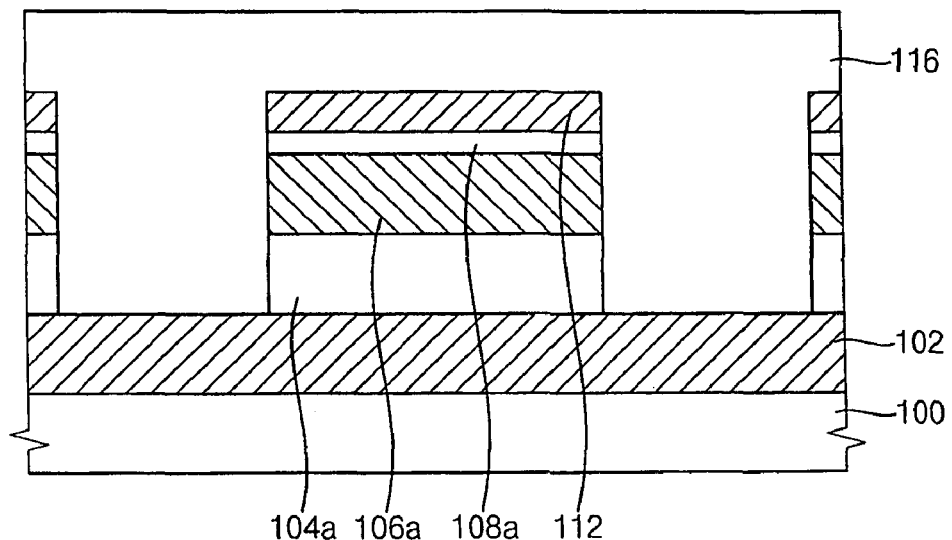
Figure 7B:
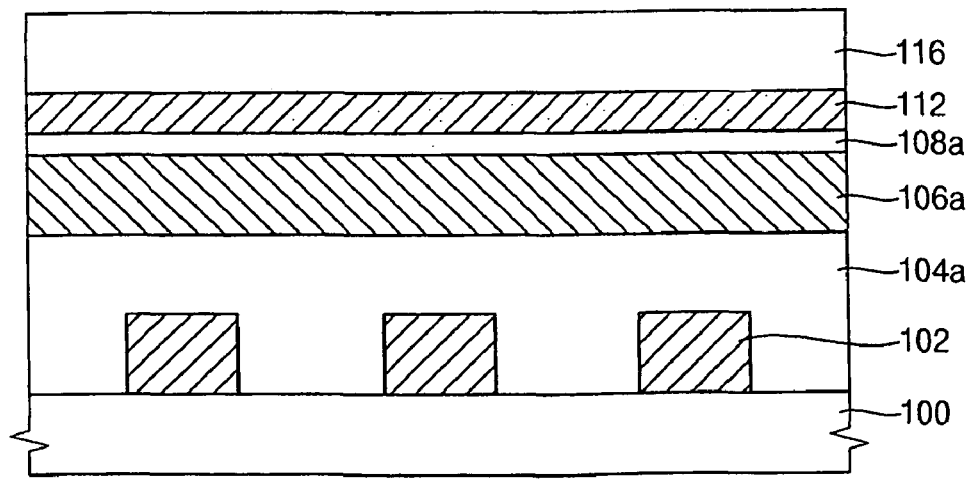

Referring to FIGS. 7A and 7B, a second insulating interlayer 116 is formed on the first hard mask 112 to fill up the first trench 114. The second insulating interlayer 116 may be formed using an oxide. Examples of the oxide for the second insulating interlayer 116 may include TEOS, USG, SOG, FOX, HDP-CVD oxide, etc.

In one example embodiment, an upper portion of the second insulating interlayer 116 may be planarized until the first hard mask 112 is exposed to thereby ensure a level upper face of the second insulating interlayer 116. The level upper face of the second insulating interlayer 116 may be obtained by a CMP process and/or an etch-back process. When an upper face of the first hard mask 112 is exposed after planarizing the second insulating interlayer 116, the upper face of the second insulating interlayer 116 may be positioned substantially the same as the upper face of the first hard mask 112. Thus, a thickness of the second insulating interlayer 116 may be easily identified such that a thickness of a second insulating interlayer pattern 118 (see FIG. 8A) may be easily controlled in a subsequent process.

In another example embodiment, the upper portion of the second insulating interlayer 116 may be planarized without exposure of the upper face of the first hard mask 112. That is, the second insulating interlayer 116 may have a predetermined thickness based on the upper face of the first hard mask 112.

In still another example embodiment, the second insulating interlayer 116 may not be planarized to simplify processes for manufacturing the memory device.

Figure 8A:
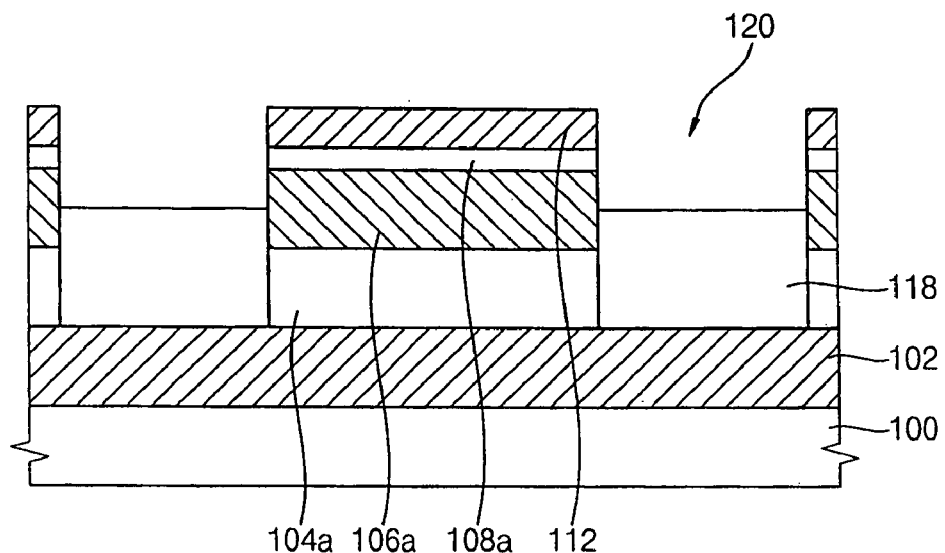
Figure 8B:
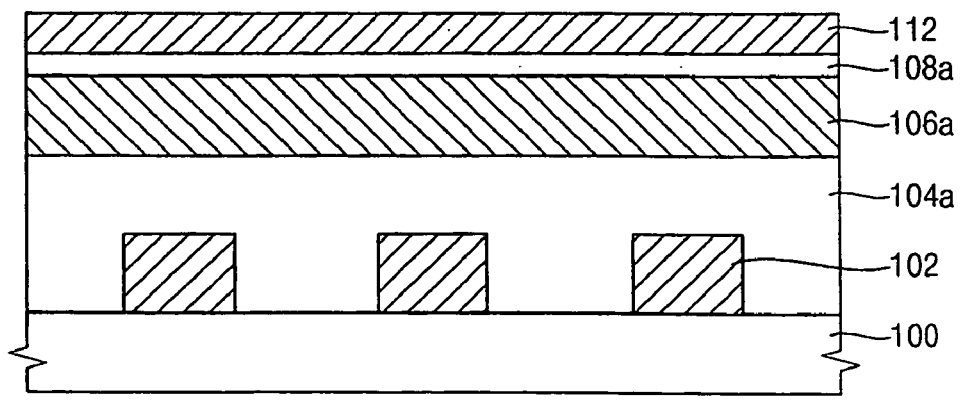

Referring to FIGS. 8A and 8B, a second insulating interlayer pattern 118 is formed by partially etching the second insulating interlayer 116. The second insulating interlayer pattern 118 may be formed by an anisotropic etching process. The second insulating interlayer pattern 118 may have an upper face substantially lower than an upper face of the preliminary reading word line 106a. However, the upper face of the second insulating interlayer pattern 118 may be substantially higher than a bottom of the preliminary reading word line 106a.

A second trench 120 is provided between adjacent preliminary reading word lines 106a in accordance with a formation of the second insulating interlayer pattern 118 on the bit line 102.

Figure 9A:
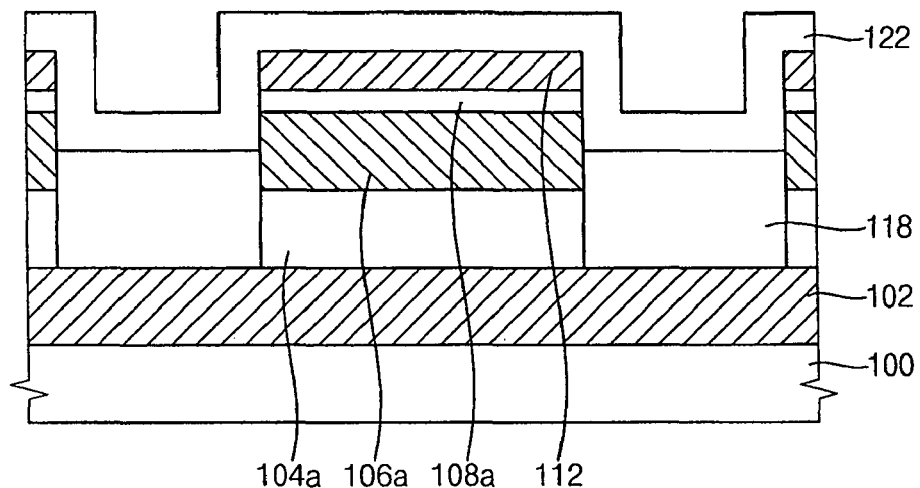
Figure 9B:
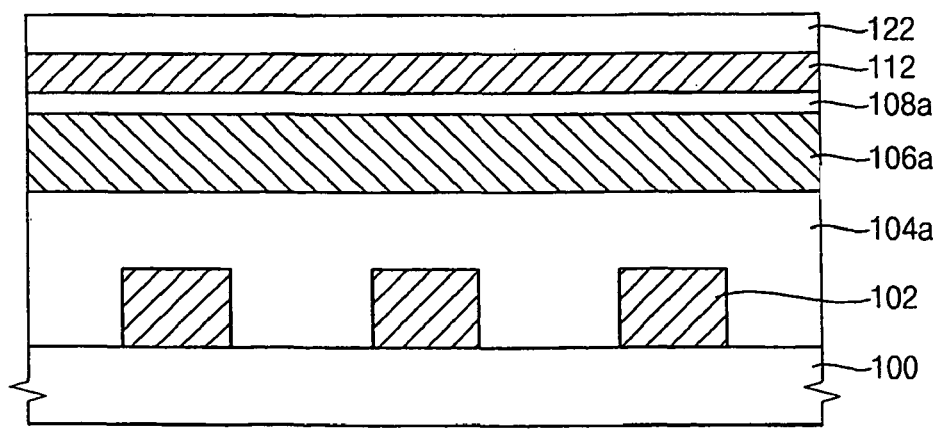

Referring to FIGS. 9A and 9B, a spacer formation layer 122 is conformably formed on an inside of the trench 120 and the first hard mask 112. That is, the spacer formation layer 122 is formed on the second insulating interlayer pattern 118, a sidewall of the second trench 120 and the first hard mask 112. In example embodiments, the spacer formation layer 122 may be formed using a material substantially the same as that of the first sacrificial interlayer pattern 108a. For example, the spacer formation layer 122 may be formed using polysilicon.

The spacer formation layer 122 will be removed from the first hard mask 112 in a subsequent process to provide a space between a sidewall of the reading word line 106b and an electrode 160 (see FIGS. 20A and 20B). Thus, the spacer formation layer 122 may have a thickness substantially the same as an interval between the reading word line 106b and the electrode 160.

Figure 10A:
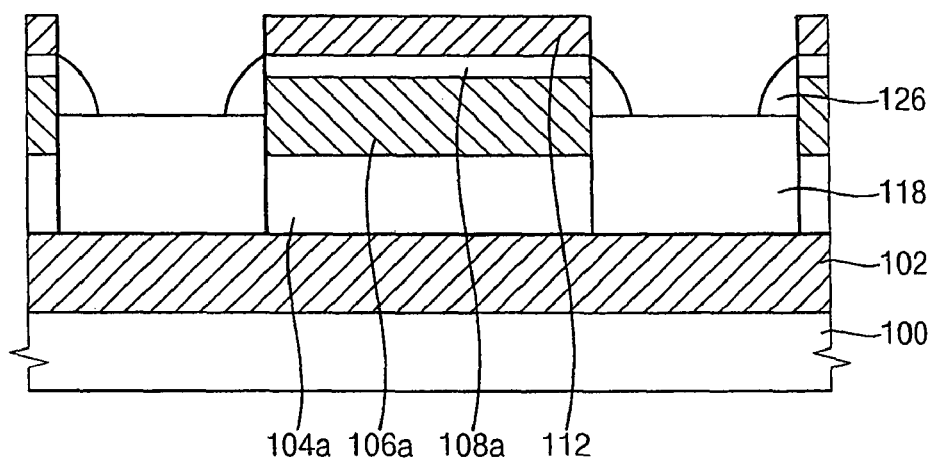
Figure 10B:
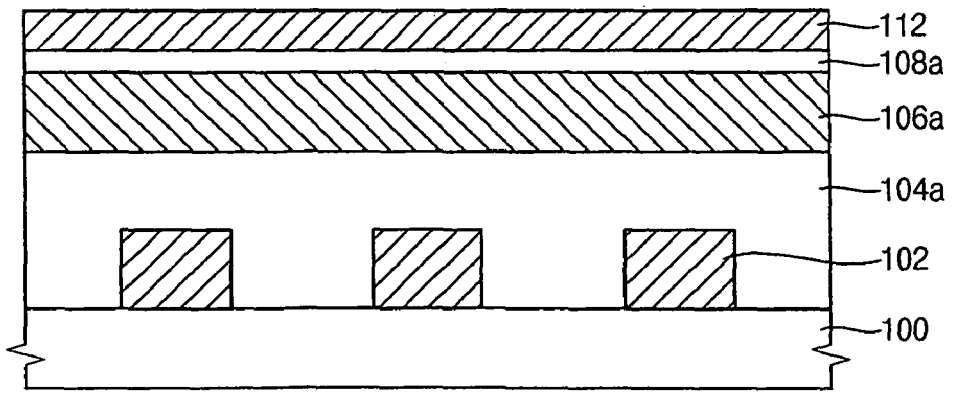

Referring FIGS. 10A and 10B, the spacer formation layer 122 is removed from the first hard mask 112 to provide a spacer 126 on the sidewall of the second trench 120. For example, the spacer formation layer 122 may be removed from the first hard mask 112 by an anisotropic etching process.

In example embodiments, the spacer 126 may be formed on sidewalls of the preliminary reading word line 106a and the first sacrificial layer pattern 108a, whereas the spacer 126 may not be positioned on a sidewall of the first hard mask 112. Therefore, the electrode 160 may not be protruded from a position where the spacer 126 makes contact with an upper face of the first sacrificial layer pattern 108a when the electrode 160 is formed on the spacer 126 and the upper face of the first sacrificial layer pattern 108a in a subsequent process.

Figure 11A:
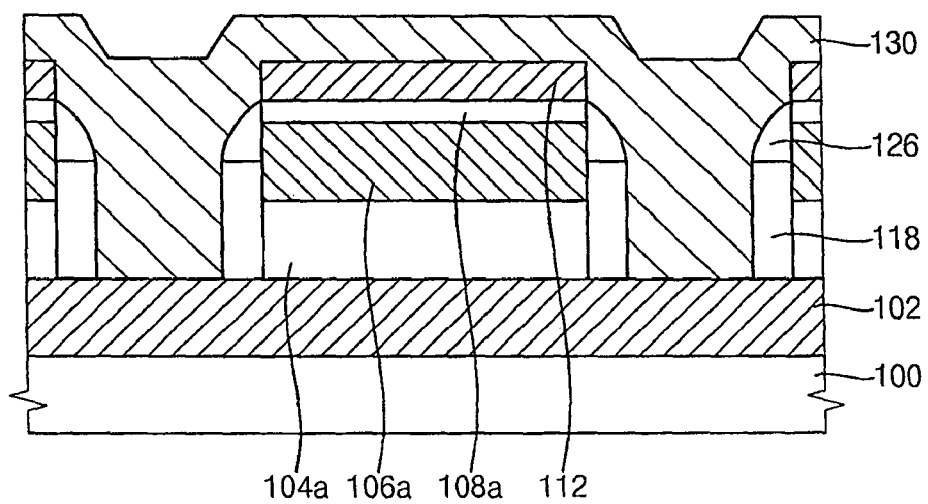
Figure 11B:
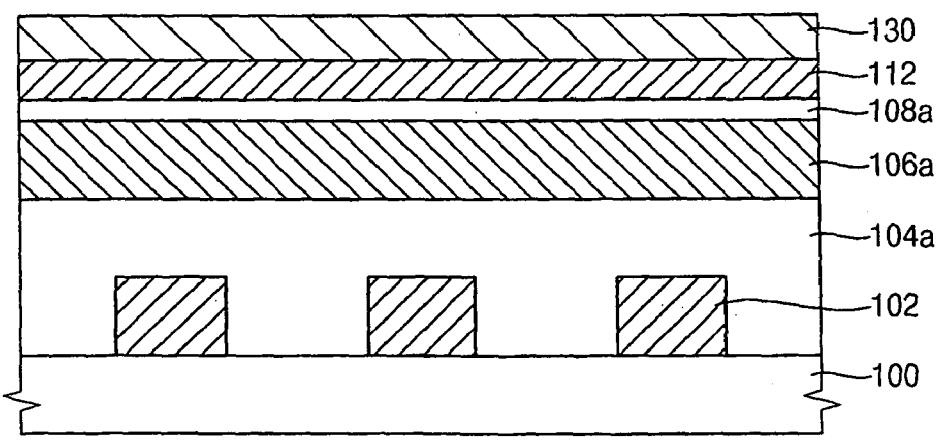

Referring to FIGS. 11A and 11B, a photoresist pattern (not illustrated) is formed on the second insulating interlayer pattern 118, the spacer 126 and the first hard mask 112. The photoresist pattern may serve as an etching mask for forming a bit line contact 132 (see FIG. 12A) electrically connected to the bit line 102. In example embodiments, the photoresist pattern may extend along the second direction and may have a bar structure, a rod structure, a string structure, etc. The second insulating interlayer pattern 118 is etched using the photoresist pattern, the first hard mask 112 and the spacer 126 as etching masks to form a bit line contact hole through the second insulating interlayer pattern 118. In example embodiments, the second insulating interlayer pattern 118 may be partially etched by an anisotropic etching process.

A second conductive layer 130 filling up the bit line contact hole is formed on the resultant structure to cover the first hard mask 112. The second conductive layer 130 may be formed using a metal, a metal compound or polysilicon with impurities. For example, the second conductive layer 130 may be formed using gold, silver, copper, aluminum, tungsten, titanium, tantalum, tungsten silicide, titanium nitride, tantalum silicide, etc. In one example embodiment, the second conductive layer 130 may be formed using a material substantially the same as that of the first conductive layer for the bit line 102. In another example embodiment, the second conductive layer 130 may be formed using a material substantially different from that of the first conductive layer for the bit line 102. The second conductive layer 130 may be formed by a PVD process or a CVD process.

Figure 12A:
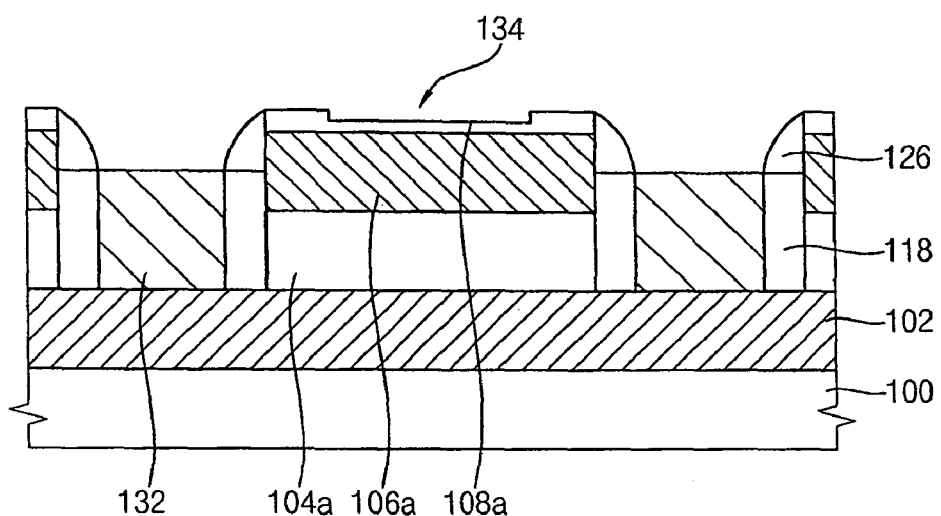
Figure 12B:
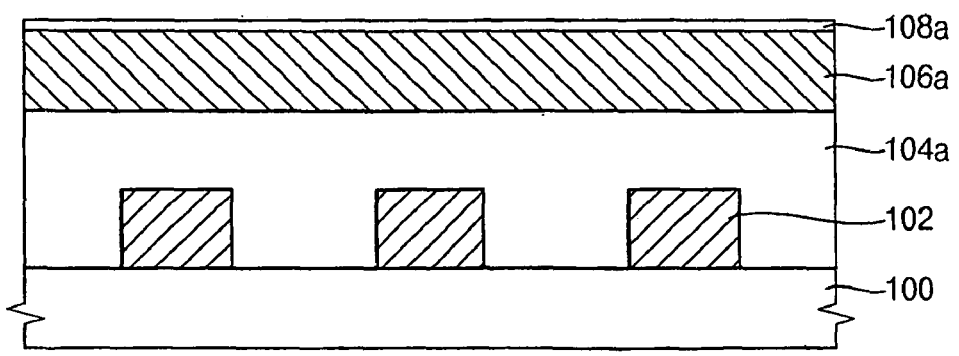

Referring to FIGS. 12A and 12B, the second conductive layer 130 is planarized until the first hard mask 112 is exposed to form a preliminary bit line contact (not illustrated) in the bit line contact hole. In example embodiments, the second conductive layer 130 may be planarized by a CMP process and/or an etch-back process. In a planarization of the second conductive layer 130, the second conductive layer 130 may remain in the bit line contact hole to electrically insulate adjacent second conductive layers 130 from each other.

The first hard mask 112 is removed from the first sacrificial layer pattern 108a after forming the preliminary bit line contact in the bit line contact.

The preliminary bit line contact may be etched until the sidewall of the spacer 126 is exposed. In example embodiments, the preliminary bit line contact may be etched by an anisotropic etching process. Thus, the bit line contact 132 is formed in the bit line contact hole. The bit line contact 132 is located on the bit line 102.

A central portion of the exposed first sacrificial layer pattern 108a is partially removed to form a dimple 134 on the first sacrificial layer pattern 108a. For example, the central portion of the exposed first sacrificial layer pattern 108a may be partially removed by a photolithography etching process. The dimple 134 may serve as a mold pattern forming two opposed contact tips 162 (see FIGS. 20A and 20B). Thus, the dimple 134 may be positioned at an end portion of the electrode 160 (See FIGS. 14A and 14B).

A thickness of the first sacrificial layer pattern 108a remaining beneath the dimple 134 may be substantially the same as an interval between the reading word line 106b and the contact tip 162. Thus, when the dimple 134 is formed on the first sacrificial layer pattern 108a, the thickness of the first sacrificial layer pattern 108a remaining beneath the dimple 134 may be advantageously adjusted.

Figure 13A:
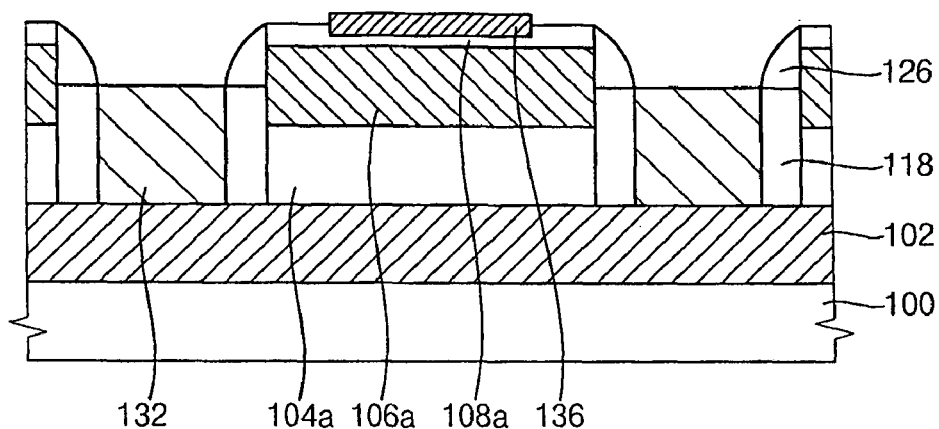
Figure 13B:
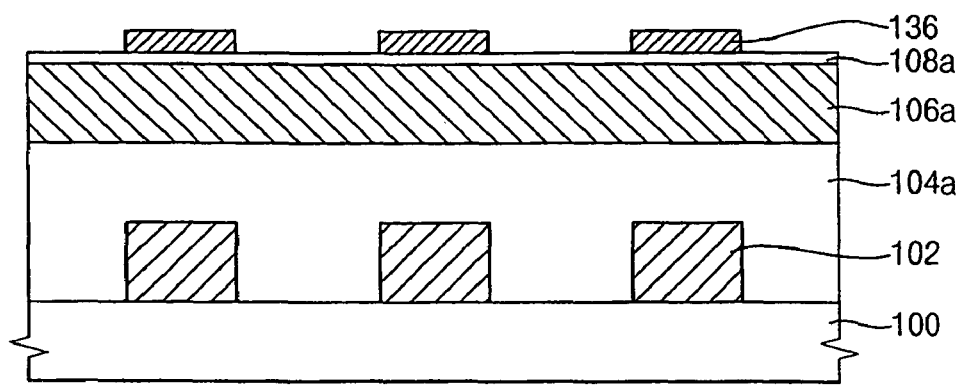

Referring FIGS. 13A and 13B, a third conductive layer (not illustrated) is formed on the bit line contact 132, the spacer 126 and the first sacrificial layer pattern 108a to fill up the dimple 134. The third conductive layer will be patterned to form the contact tip 162 in a subsequent process.

The third conductive layer may be formed using a conductive material having an elasticity. Thus, a lateral portion of the contact tip 162 may be bent in a predetermined direction in response to a voltage applied to the contact tip 162. In example embodiments, the third conductive layer may be formed using a metal such as titanium, a metal compound such as titanium silicide, or other conductive material such as a carbon nanotube. The third conductive layer may be formed by a PVD process, a CVD process, an electric discharge process, etc. For example, the third conductive layer may be formed by the PVD process or the CVD process when the third conductive layer includes the metal or the metal compound. Alternatively, the third conductive layer may be formed by the electric discharge process when the third conductive layer includes the carbon nanotube.

An etching mask (not illustrated) is formed on the third conductive layer. The etching mask may cover a portion of the third conductive layer positioned on the dimple 134. The third conductive layer is etched until the first sacrificial layer 108a is exposed using the etching mask so that a preliminary contact tip 136 is formed on the first sacrificial layer pattern 108a. The preliminary contact tip 136 is positioned on the dimple 134. An upper face of the preliminary contact tip 136 filling the dimple 134 may be substantially higher than an upper face of the first sacrificial layer pattern 108a. That is, the preliminary contact tip 136 may be protruded from the first sacrificial layer pattern 108a.

Figure 14A:
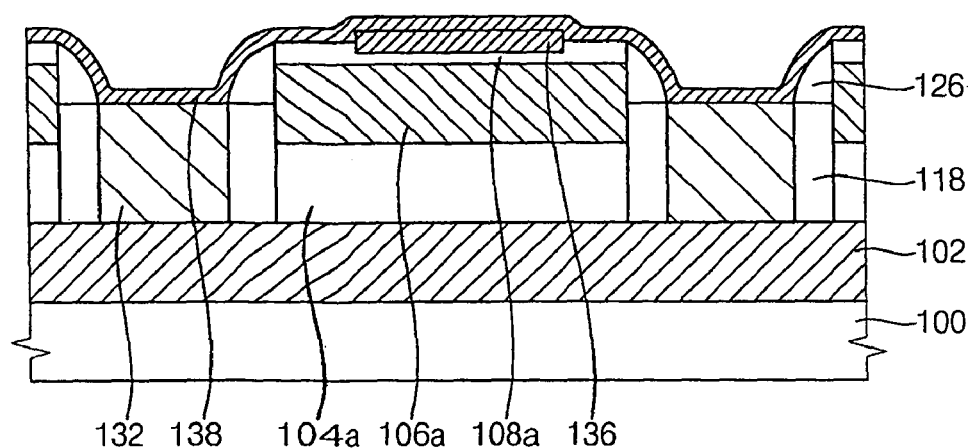
Figure 14B:
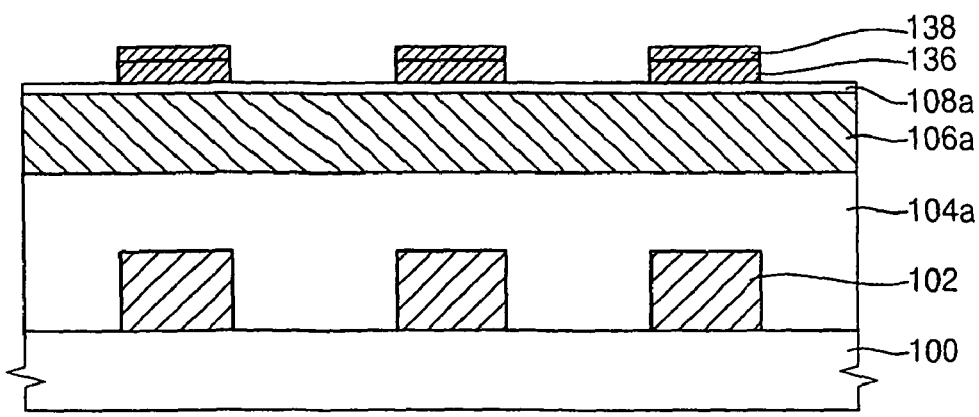

Referring to FIGS. 14A and 14B, a fourth conductive layer (not illustrated) is formed on the preliminary contact tip 136, the first sacrificial layer pattern 108a, the spacer 126 and the bit line contact 132. A portion of the fourth conductive layer covering the preliminary contact tip 136 may be substantially higher than other portions of the fourth conductive layer. That is, the fourth conductive layer may have a protruding portion on the preliminary contact tip 136.

The fourth conductive layer may be formed using a conductive material having an elasticity. Thus, a lateral portion of the electrode 160 may be bent along a predetermined direction in response to a voltage applied to the electrode 160. In example embodiments, the fourth conductive layer may be formed using a metal such as titanium, a metal compound such as titanium silicide, or other conductive material such as a carbon nanotube. The fourth conductive layer may be formed by a PVD process, a CVD process, an electric discharge process, etc. For example, the fourth conductive layer may be formed by the PVD process or the CVD process when the fourth conductive layer includes the metal or the metal compound. Alternatively, the fourth conductive layer may be formed by the electric discharge process when the fourth conductive layer includes the carbon nanotube. In example embodiments, the fourth conductive layer may be formed a material substantially the same as that of the third conductive layer.

An etching mask (not illustrated) is formed on the fourth conductive layer. The etching mask may have a pattern corresponding to a construction of the bit line 102. For example, the etching mask may have a bar structure, a rod structure, a string structure, etc. The fourth conductive layer is partially etched using the etching mask to form a preliminary electrode 138 on the preliminary contact tip 136, the first sacrificial layer pattern 108a, the spacer 126 and the bit line contact 132. The preliminary electrode 138 may correspond to the bit line 102, and may extend along the first direction. In example embodiments, the preliminary electrode 138 may have a bar shape, a pillar shape, a column shape, etc.

Figure 15A:
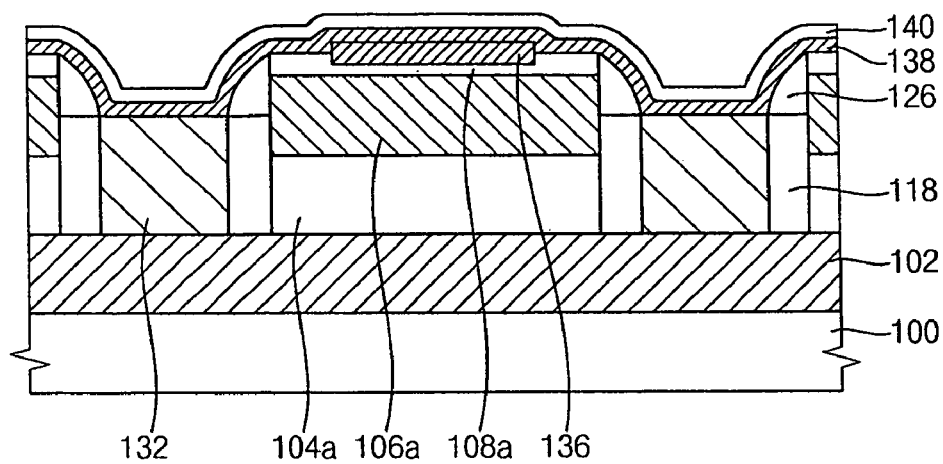
Figure 15B:
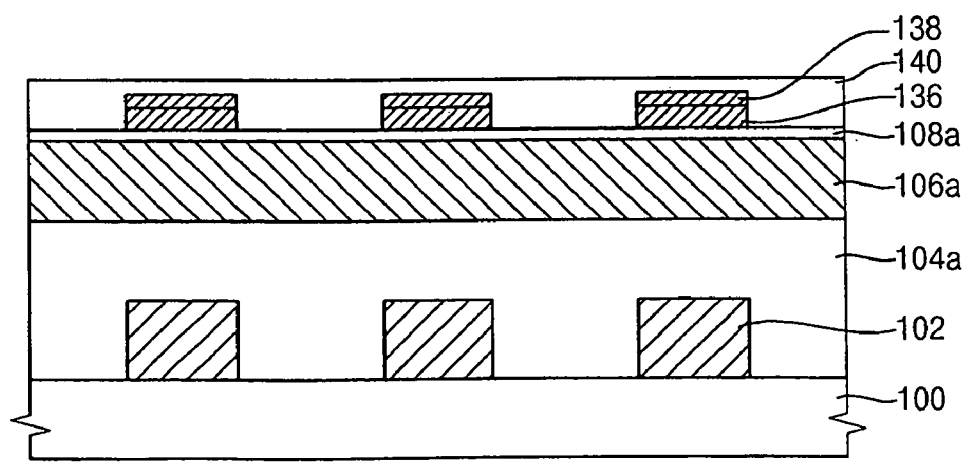

Referring to FIGS. 15A and 15B, a second sacrificial layer 140 is formed on the preliminary electrode 138 and the first sacrificial layer pattern 108a. In example embodiments, the second sacrificial layer 140 may be formed using a material substantially the same as that in the first sacrificial layer pattern 108a. For example, the second sacrificial layer 140 may be formed using polysilicon.

Figure 19A:
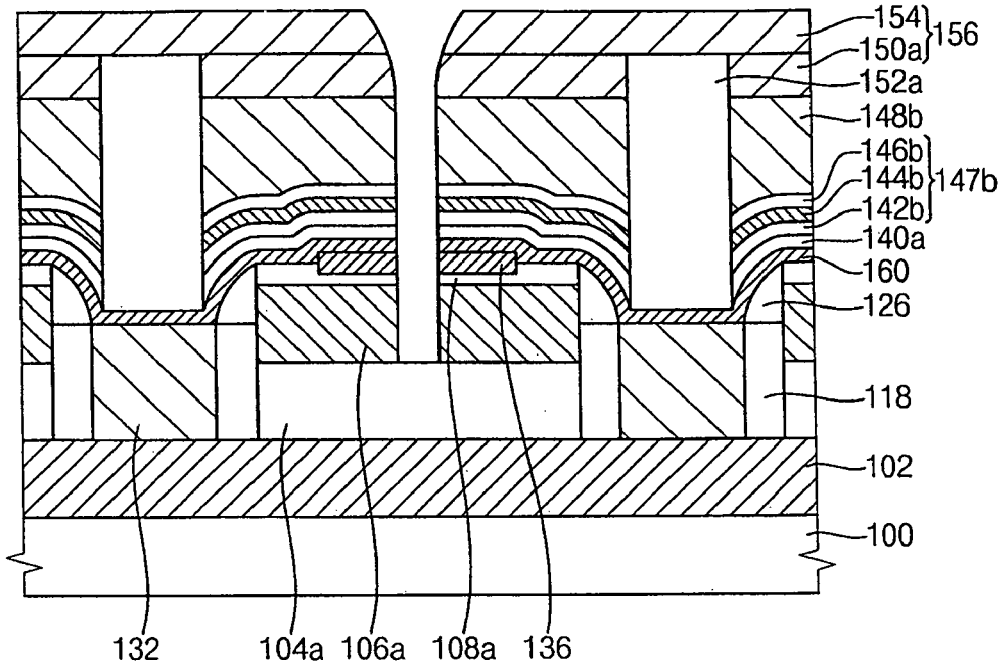
Figure 19B:
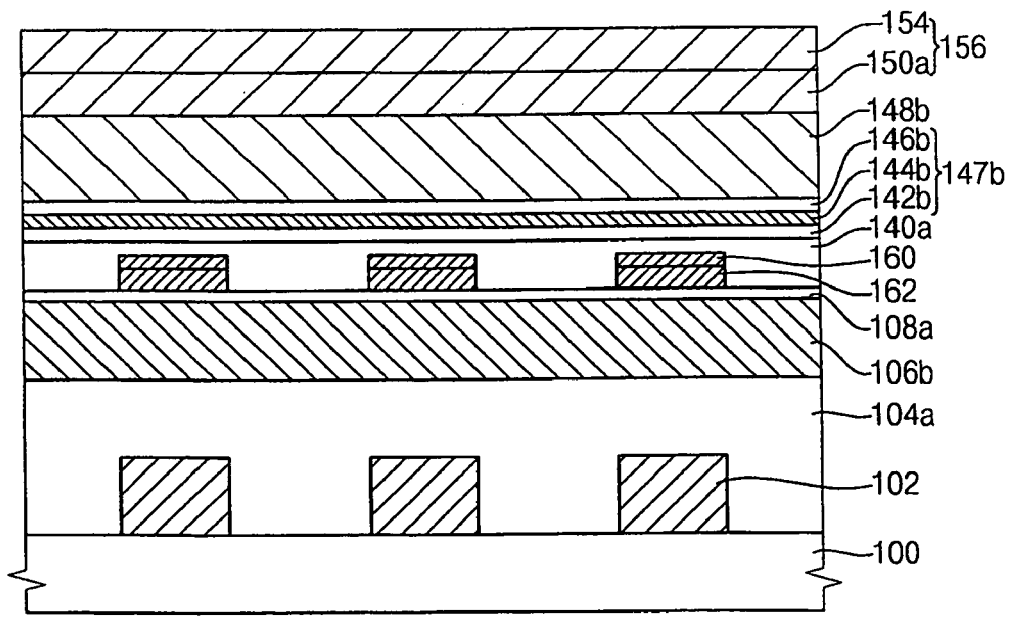

The second sacrificial layer 140 will be removed in a subsequent process to provide a space between the electrode 160 and a writing word line 148b (see FIGS. 19A and 19B). Therefore, the second sacrificial layer 140 may have a thickness corresponding to an interval between the electrode 160 and the writing word line 148b (see FIGS. 20A and 20B).

Figure 16A:
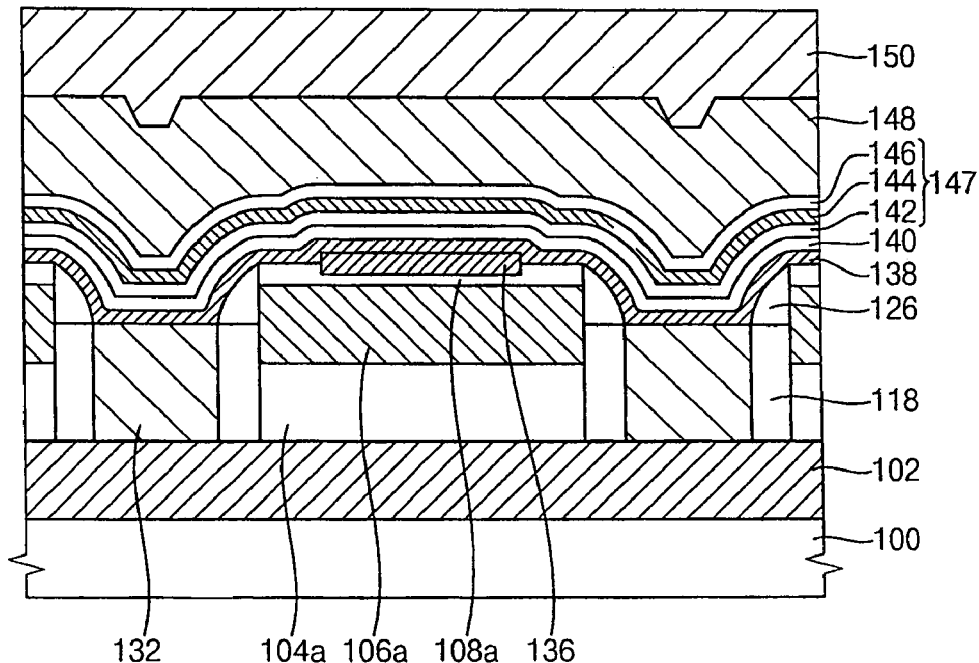
Figure 16B:
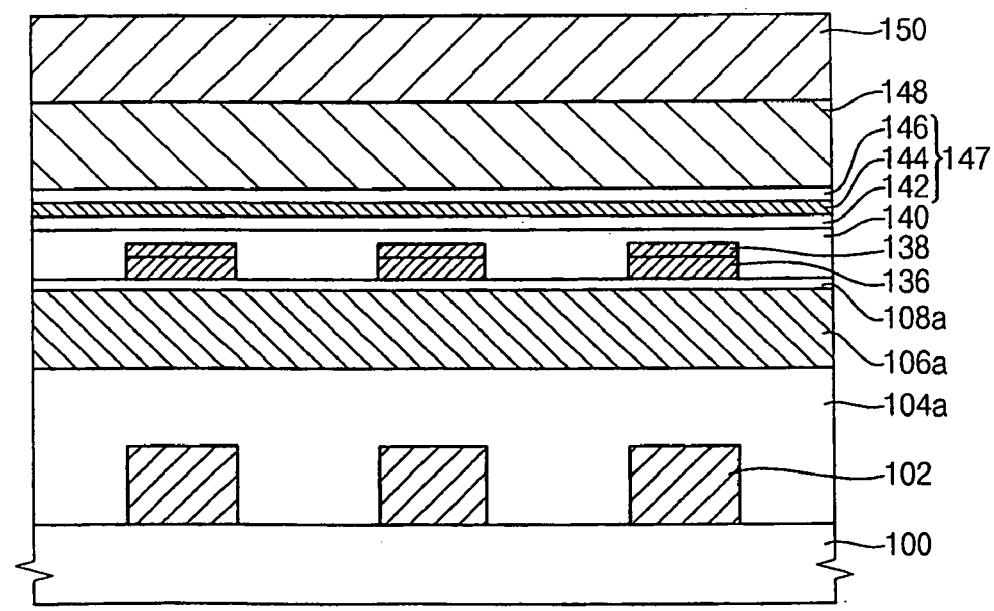

Referring to FIGS. 16A and 16B, the first preliminary charge trapping structure 147 is formed on the second sacrificial layer 140. The first preliminary charge trapping structure 147 may include a silicon oxide layer 142, a charge trapping layer 144 and a dielectric layer 146.

In example embodiments, the first preliminary charge trapping structure 147 may have a multi-layered structure that includes silicon oxide layers and a silicon nitride layer. For example, the first preliminary charge trapping structure 147 may include the silicon oxide layer, the silicon nitride layer and the silicon oxide layer successively stacked on the second sacrificial layer 140.

A fifth conductive layer 148 is formed on the first preliminary charge trapping structure 147. The fifth conductive layer 148 may serve as the writing word line 148b. The fifth conductive layer 148 may be formed using a metal or a metal compound. For example, the fifth conductive layer 148 may be formed using gold, silver, copper, aluminum, tungsten, titanium, tantalum, tungsten silicide, titanium nitride, tantalum silicide, etc. Theses may be used alone or in a combination thereof.

A second hard mask layer 150 is formed on the fifth conductive layer 148. The second hard mask layer 150 may be formed using a nitride such as silicon nitride.

Figure 17A:
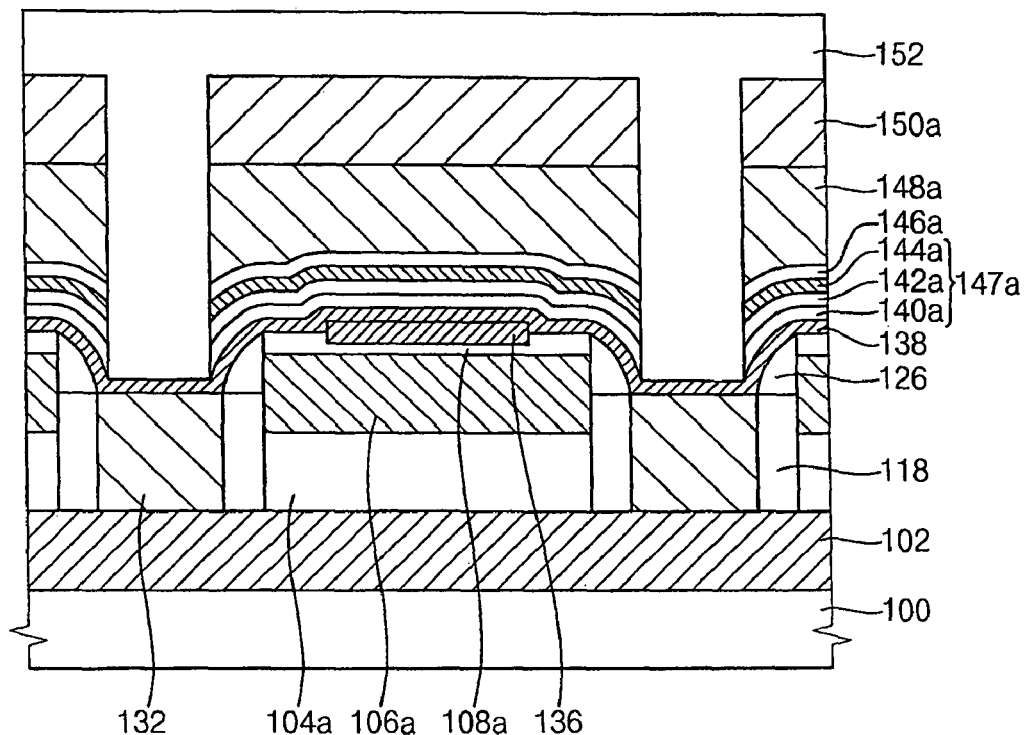
Figure 17B:
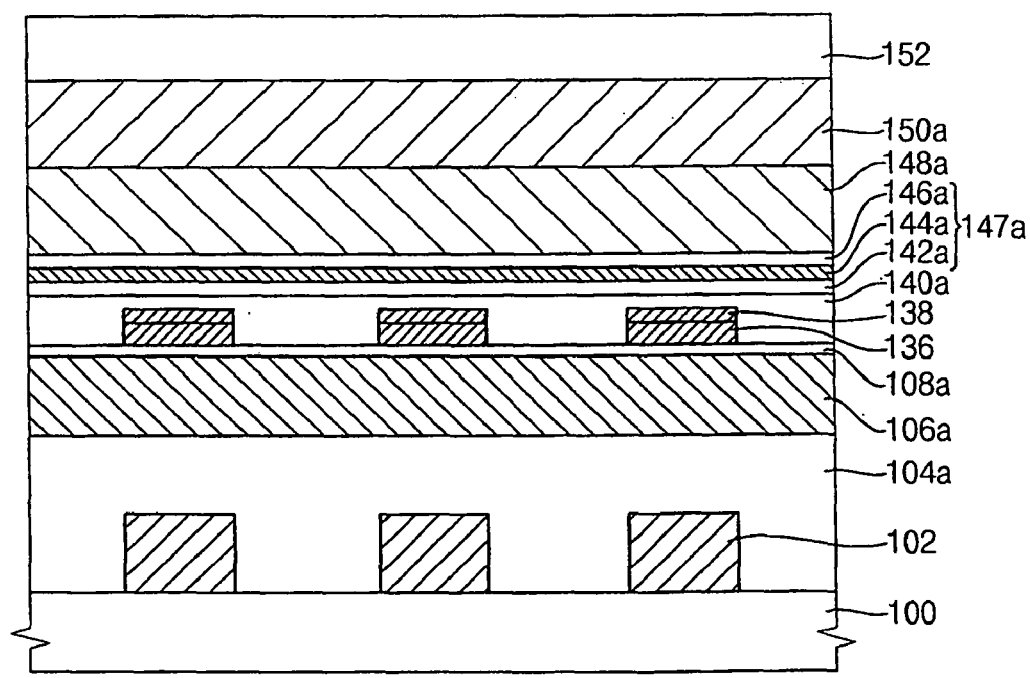

Referring to FIGS. 17A and 17B, the second hard mask layer 150 may be partially etched to form a second hard mask 150a on the fifth conductive layer 148. In example embodiments, a portion of the second hard mask layer 150 corresponding to the bit line contact 132 may be etched. For example, the second hard mask 150a may be formed by a photolithography process.

The fifth conductive layer 148, the first preliminary charge trapping structure 147 and the second sacrificial layer 140 are etched using the second hard mask 150a as an etching mask. Thus, an opening exposing the bit line contact 132 is provided through the fifth conductive layer 148, the first preliminary charge trapping structure 147 and the second sacrificial layer 140. The opening may extend along the second direction.

The fifth conductive layer 148, the first preliminary charge trapping structure 147 and the second sacrificial layer 140 may be electrically isolated from one another by forming the opening. After a formation of the opening, a preliminary writing word line 148a, a second preliminary charge trapping structure 147a and the second sacrificial layer pattern 140a are formed on the preliminary electrode 138. The second preliminary charge trapping structure 147a includes a preliminary silicon oxide layer pattern 142a, a preliminary charge trapping layer pattern 144a and a preliminary dielectric layer pattern 146a.

An insulation layer 152 is formed on the second hard mask 150a to fill up the opening. The insulation layer 152 may be formed using an oxide such as silicon oxide.

Figure 18A:
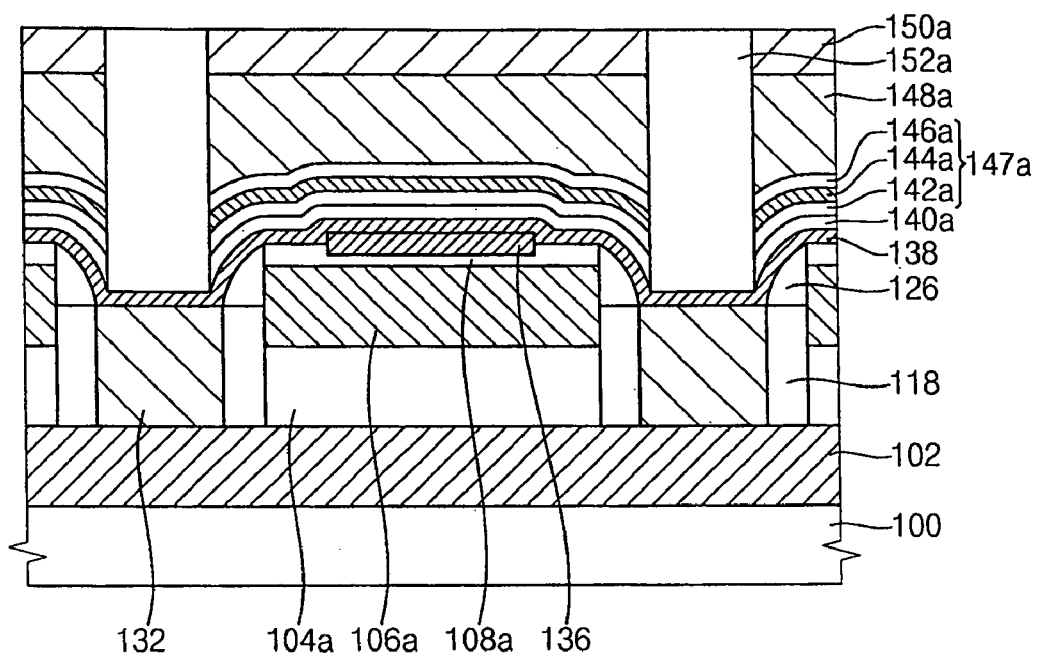
Figure 18B:
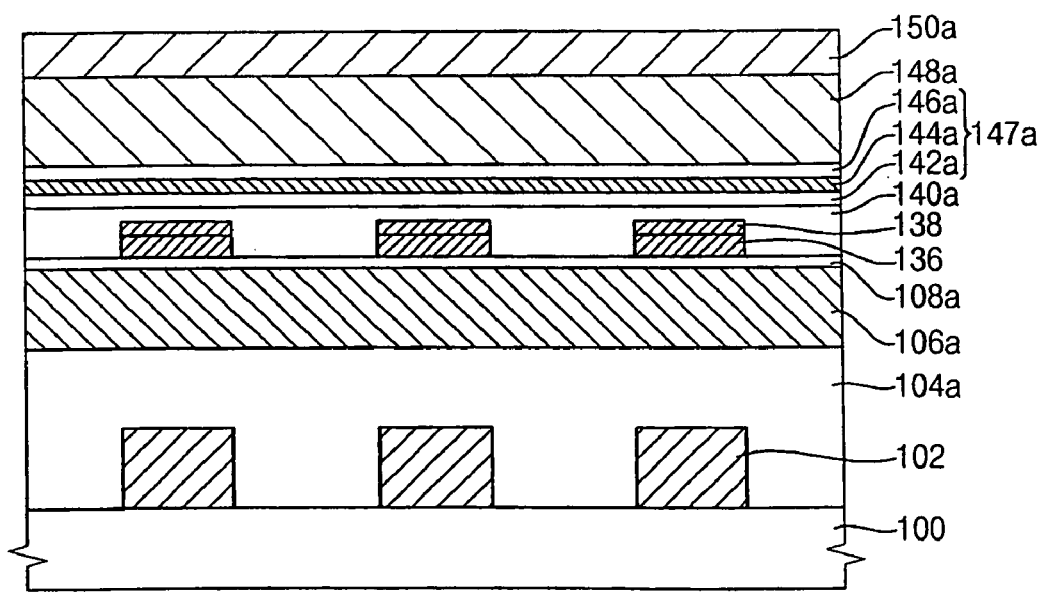

Referring to FIGS. 18A and 18B, the insulation layer 152 is planarized by a planrization process until an upper face of the second hard mask 150a is exposed. Thus, an insulation layer pattern 152a is formed in the opening. The insulation layer pattern 152a may be formed by a CMP process and/or an etch back process. In example embodiments, the second hard mask 150a may be partially removed so that a thickness of the second hard mask 150a may be decreased in the planarization process.

Referring to FIGS. 19A and 19B, a third hard mask layer is formed on the second hard mask 150a and the insulation layer pattern 152a. In example embodiments, the third hard mask layer may be formed using a material substantially the same as that of the second hard mask 150a. For example, the third hard mask layer may be formed using a nitride such as silicon nitride.

The third hard mask layer may support the writing word line 148b. Thus, the third hard mask layer may prevent the writing word line 148b from collapsing when the spaces between the electrode 160 and the writing word line 148b and between the electrode 160 and the reading word line 106b are provided in subsequent processes.

The third hard mask layer and the second hard mask 150a are etched to form a mask structure 156 including a third hard mask 154 and the second hard mask 150a on the preliminary writing word line 148a and the insulation layer pattern 152a. The mask structure 156 may serve as an etching mask for separating the preliminary writing word line 148a, the second preliminary charge trapping structure 147a, the preliminary contact tip 136 and the preliminary reading word line 106a. In example embodiments, the mask structure 156 may expose a central portion of the preliminary writing word line 148a.

The preliminary writing word line 148a, the second preliminary charge trapping structure 147a, the second sacrificial layer pattern 140a, the preliminary contact tip 136, the first sacrificial layer pattern 108a and the preliminary reading word line 106a are partially etched using the mask structure 156 as an etching mask. Thus, adjacent preliminary writing word lines 148a, adjacent second preliminary charge trapping structures 147a, adjacent second sacrificial layer pattern 140a, adjacent preliminary contact tip 136, adjacent first sacrificial layer pattern 108a and adjacent preliminary reading word line 106a are provided over the substrate 100, respectively.

The preliminary writing word line 148a is partially etched to form two adjacent writing word lines 148b extending along the second direction. A charge trapping structure 147b is formed below the writing word line 148b. The charge trapping structure 147b may include a silicon oxide layer pattern 142b, a charge trapping layer pattern 144b and a dielectric layer pattern 146b. The preliminary electrode 138 and the preliminary contact tip 136 are divided to two adjacent electrodes 160 and two adjacent contact tips 162. Additionally, the preliminary reading word line 106a is partially etched to form two adjacent reading word lines 106b extending along the second direction.

The electrode 160 may be electrically connected to the bit line contact 132 and may be conformably prolonged along a sidewall and an upper face of the reading word line 106b. The contact tips 162 are positioned at both end portions of the electrode 160. Each of the contact tips 162 may protrude toward the reading word line 106b or the writing word line 148b.

Referring to FIGS. 20A and 20B, the first and the second sacrificial layer patterns 108a and 140a exposed by an opening between adjacent writing word lines 148b are removed. Thus, the memory device including the charge trapping structure 147b is provided on the substrate 100. In example embodiments, the first and the second sacrificial layer patterns 108a and 140a may be removed by a wet etching process. The first and the second sacrificial layer patterns 108a and 140a are removed to provide the spaces between the electrode 160 and the reading word line 106b and between the electrode 160 and the writing word line 148b. Thus, the electrode 160 may be bent toward the reading word line 106b or the writing word line 148b in the spaces. The contact tip 162 positioned at the end portions of the electrode 160 may make contact with the reading word line 106b or the writing word line 148b in accordance with a bending of the electrode 160.

A voltage applied to the end portions of the writing word line 148b and the bit line 102 may be adjusted to make contact the contact tip 162 with the writing word line 148b. Charges may be injected into the charge trapping layer pattern 144b by applying the voltage to the contact tip 162. When the charges are sufficiently injected into the charge trapping layer pattern 144b, the voltage applied to the end portions of the writing word line 148b and the bit line 102 may be adjusted to separate the contact tip 162 from the writing word line 148b.

In example embodiments, an inactive gas may fill up the spaces generated between the electrode 160 and the reading word line 106b and between the electrode 160 and the writing word line 148b. The inactive gas may include a nitrogen gas, an argon gas, a helium gas, etc. Alternatively, the spaces may be maintained in a vacuum state without an injection of the inactive gas.

In example embodiments, a third insulating interlayer (not illustrated) may be additionally formed between adjacent mask structures 156. When a lower face of the third insulating interlayer is disposed below a lower face of the charge trapping structure 147b, the contact tip 162 may not make contact with the writing word line 148b. Thus, the third insulating interlayer may have the lower face substantially higher than that of the charge trapping structure 147b. The third insulating interlayer may separate the spaces between the reading word line 106b and the writing word line 148b from an outside.

According the present invention, the memory device having the above-described construction may operate with a low voltage. Further, residues may be easily removed from a gap between the electrode and the word line so that a leakage current of the memory device may be effectively reduced. Moreover, cross talk between adjacent conductive lines may decrease to improve operation characteristics of the memory device because a distance between the bit line and the writing word line may increase.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a memory device, comprising:
   forming a bit line on a substrate;
   forming a preliminary reading word line over the bit line, wherein the preliminary reading word line is electrically insulated from the bit line;
   forming a bit line contact electrically connected to the bit line between adjacent preliminary reading word lines, wherein the bit line contact has an upper face substantially lower than an upper face of the preliminary reading word line;
   forming a preliminary contact tip over a central portion of the preliminary reading word line, wherein the preliminary contact tip is separated from the preliminary reading word line;
   forming a preliminary electrode on the bit line contact and the preliminary contact tip, wherein the preliminary electrode extends substantially in parallel to the preliminary reading word line and includes a conductive material being bent in response to an applied voltage;
   forming a preliminary writing word line over the preliminary electrode, wherein the preliminary writing word line corresponds to the preliminary electrode and the preliminary reading word line, and is separated from the preliminary contact tip; and
   etching central portions of the preliminary writing word line, the preliminary contact tip, the preliminary electrode and the preliminary reading word line to form a writing word line, a contact tip, an electrode and a reading word line.

2. The method of claim 1, further comprising:
   forming a first insulating interlayer on the substrate to cover the bit line after forming the bit line;
   forming a first sacrificial layer and a first hard mask layer on the first insulating interlayer; and
   etching the first insulating interlayer, the first sacrificial layer and the first hard mask layer to form a first insulating interlayer pattern, a first sacrificial layer pattern and a first hard mask.

3. The method of claim 2, further comprising forming a second insulating interlayer pattern on the substrate between adjacent first insulating interlayer patterns, wherein the second insulating interlayer pattern has an upper face substantially lower than the upper face of the preliminary reading word line.

4. The method of claim 3, further comprising forming a spacer on sidewalls of the preliminary reading word line and the first sacrificial layer pattern.

5. The method of claim 4, wherein forming the bit line contact comprises:
   forming a photoresist pattern on the second insulating interlayer pattern, the spacer and the first hard mask;
   at least partially etching the second insulating interlayer pattern using the first hard mask, the spacer and the photoresist pattern to form an opening that exposes the bit line;
   forming a first conductive layer to fill up the opening; and
   partially removing the first conductive layer to form the bit line contact in the opening, wherein the bit line contact has an upper face substantially lower than the upper face of the preliminary reading word line.

6. The method of claim 5, wherein partially removing the first conductive layer comprises:
   exposing the first hard mask by planarizing the first conductive layer to form a preliminary bit line contact; and
   etching the preliminary bit line contact until the preliminary bit line contact has an upper face substantially lower than the upper face of the reading word line.

7. The method of claim 5, further comprising removing the first hard mask from the first sacrificial layer pattern after forming the bit line contact.

8. The method of claim 1, wherein forming the preliminary contact tip comprises:
   removing the first hard mask from the first sacrificial layer pattern;
   partially etching the first sacrificial layer pattern to form a dimple; and
   forming a conductive layer pattern to fill up the dimple, the conductive layer pattern protruding from the first sacrificial layer pattern.

9. The method of claim 1, wherein the bit line extends along a first direction and the preliminary word line extends along a second direction substantially perpendicular to the first direction.

10. The method of claim 1, further comprising forming a charge trapping structure separated from the preliminary electrode below the preliminary writing word line, wherein the charge trapping structure includes an oxide layer pattern, a charge trapping layer pattern for trapping charges and a dielectric layer pattern.

11. The method of claim 1, further comprising forming a second sacrificial layer on the preliminary electrode.

12. The method of claim 11, wherein forming the preliminary writing word line comprises:
   forming a second conductive layer on the second sacrificial layer;
   forming a second hard mask on the second conductive layer; and
   etching the second conductive layer and the second sacrificial layer using the second hard mask to form an opening that exposes an upper face of the preliminary electrode.

13. The method of claim 12, further comprising:
   forming an insulation layer on the second hard mask to fill up the opening; and
   planarizing the insulation layer to form an insulation layer pattern in the opening.

14. The method of claim 1, further comprising removing layers between the reading word line and the contact tip, between the reading word line and the electrode, between the writing word line and the contact tip, and between the writing word line and the electrode.

15. The method of claim 1, wherein the preliminary electrode and the preliminary contact tip includes at least one selected from the group consisting of titanium, titanium nitride and a carbon nanotube.

* * * * *